US008218382B2

(12) United States Patent
Ware

(10) Patent No.: US 8,218,382 B2
(45) Date of Patent: Jul. 10, 2012

(54) MEMORY COMPONENT HAVING A WRITE-TIMING CALIBRATION MODE

(75) Inventor: Frederick A. Ware, Los Altos Hills, CA (US)

(73) Assignee: Rambus Inc., Sunnyvale, CA (US)

(*) Notice: Subject to any disclaimer, the term of this patent is extended or adjusted under 35 U.S.C. 154(b) by 0 days.

(21) Appl. No.: 13/228,070

(22) Filed: Sep. 8, 2011

(65) Prior Publication Data
US 2011/0317504 A1    Dec. 29, 2011

Related U.S. Application Data

(60) Division of application No. 12/757,035, filed on Apr. 8, 2010, now Pat. No. 8,045,407, which is a division of application No. 12/246,415, filed on Oct. 6, 2008, now Pat. No. 7,724,590, which is a division of application No. 11/746,007, filed on May 8, 2007, now Pat. No. 7,480,193, which is a continuation of application No. 10/942,225, filed on Sep. 15, 2004, now Pat. No. 7,301,831.

(51) Int. Cl.
G11C 7/00    (2006.01)
(52) U.S. Cl. .......................... 365/194; 365/191
(58) Field of Classification Search ................... 365/194
See application file for complete search history.

(56) References Cited

U.S. PATENT DOCUMENTS

| | | | |
|---|---|---|---|
| 3,820,081 A | 6/1974 | Donahue | 360/172.5 |
| 3,950,735 A | 4/1976 | Patel | 340/172.5 |
| 4,183,095 A | 1/1980 | Ward | 365/189 |
| 4,266,282 A | 5/1981 | Henle et al. | 365/52 |
| 4,280,221 A | 7/1981 | Chun et al. | 375/17 |
| 4,315,308 A | 2/1982 | Jackson | 364/200 |
| 4,330,852 A | 5/1982 | Redwine et al. | 365/221 |
| 4,337,523 A | 6/1982 | Hotta et al. | 365/194 |
| 4,445,204 A | 4/1984 | Nishiguchi | 365/194 |
| 4,499,536 A | 2/1985 | Gemma et al. | 364/200 |
| 4,567,545 A | 1/1986 | Mettler | 361/401 |
| 4,637,018 A | 1/1987 | Flora et al. | 371/1 |
| 4,646,270 A | 2/1987 | Voss | 365/230 |
| 4,656,605 A | 4/1987 | Clayton | 365/52 |
| 4,712,190 A | 12/1987 | Guglielmi et al. | 364/900 |
| 4,719,602 A | 1/1988 | Hag et al. | 365/230 |

(Continued)

FOREIGN PATENT DOCUMENTS

EP    0379772 A2    8/1990
(Continued)

OTHER PUBLICATIONS

Ware, Frederick re U.S. Appl. No. 12/757,035, filed Apr. 8, 2010 re Information Disclosure Statement submitted on Sep. 17, 2010. 12 Pages.

(Continued)

*Primary Examiner* — Son Mai
(74) *Attorney, Agent, or Firm* — Charles Shemwell

(57) ABSTRACT

In memory component having a write-timing calibration mode, control information that specifies a write operation is received via a first external signal path and write data corresponding to the write operation is received via a second external signal path. The memory component receives multiple delayed versions of a timing signal used to indicate that the write data is valid write data, and outputs signals corresponding to the multiple delayed versions of the timing signal to enable determination, in a memory controller, of a delay interval between outputting the control information on the first external signal path and outputting the write data on the second external signal path.

21 Claims, 9 Drawing Sheets

U.S. PATENT DOCUMENTS

| | | | |
|---|---|---|---|
| 4,755,937 A | 7/1988 | Glier | 364/200 |
| 4,763,249 A | 8/1988 | Bomba et al. | 364/200 |
| 4,785,206 A | 11/1988 | Hoshi | |
| 4,792,926 A | 12/1988 | Roberts | 365/189 |
| 4,792,929 A | 12/1988 | Olson et al. | 365/233 |
| 4,799,199 A | 1/1989 | Scales, III et al. | 365/230 |
| 4,800,530 A | 1/1989 | Itoh et al. | 365/189 |
| 4,821,226 A | 4/1989 | Christopher et al. | 364/900 |
| 4,825,411 A | 4/1989 | Hamano | 365/189 |
| 4,845,664 A | 7/1989 | Aichelmann, Jr. et al. | 364/900 |
| 4,845,677 A | 7/1989 | Chappell et al. | 365/189.02 |
| 4,849,937 A | 7/1989 | Yoshimoto | 365/189.05 |
| 4,866,675 A | 9/1989 | Kawashima | 365/194 |
| 4,875,192 A | 10/1989 | Matsumoto | 365/193 |
| 4,882,712 A | 11/1989 | Ohno et al. | 365/206 |
| 4,891,791 A | 1/1990 | Iijima | 365/189.01 |
| 4,916,670 A | 4/1990 | Suzuki et al. | 365/233 |
| 4,920,483 A | 4/1990 | Pogue et al. | 364/200 |
| 4,928,265 A | 5/1990 | Higuchi et al. | 365/189.01 |
| 4,937,734 A | 6/1990 | Bechtolsheim | 364/200 |
| 4,945,516 A | 7/1990 | Kashiyama | 365/189.05 |
| 4,953,128 A | 8/1990 | Kawai et al. | 365/194 |
| 5,001,672 A | 3/1991 | Ebbers et al. | 365/230.05 |
| 5,077,693 A | 12/1991 | Hardee et al. | 365/230.08 |
| 5,083,296 A | 1/1992 | Hara et al. | 365/230.02 |
| 5,097,489 A | 3/1992 | Tucci | 375/120 |
| 5,111,386 A | 5/1992 | Fujishima et al. | 395/425 |
| 5,117,389 A | 5/1992 | Yiu | 365/104 |
| 5,124,589 A | 6/1992 | Shiomi et al. | 307/465 |
| 5,140,688 A | 8/1992 | White et al. | 395/550 |
| 5,179,687 A | 1/1993 | Hidaka et al. | 395/425 |
| 5,260,905 A | 11/1993 | Mori | 365/230.05 |
| 5,276,858 A | 1/1994 | Oak et al. | 395/550 |
| 5,301,278 A | 4/1994 | Bowater et al. | 395/275 |
| 5,305,278 A | 4/1994 | Inoue | 365/230.03 |
| 5,311,483 A | 5/1994 | Takasugi | 365/233 |
| 5,319,755 A | 6/1994 | Horowitz | 395/325 |
| 5,323,358 A | 6/1994 | Toda et al. | 365/230.09 |
| 5,327,390 A | 7/1994 | Takasugi | 365/230 |
| 5,329,484 A | 7/1994 | Tsuiki | 365/45 |
| 5,339,276 A | 8/1994 | Takasugi | 365/230.02 |
| 5,341,341 A | 8/1994 | Fukuzo | 365/233 |
| 5,345,573 A | 9/1994 | Bowden, III et al. | 395/400 |
| 5,357,621 A | 10/1994 | Cox | 395/400 |
| 5,365,489 A | 11/1994 | Jeong | 365/230.03 |
| 5,379,438 A | 1/1995 | Bell et al. | 395/800 |
| 5,381,376 A | 1/1995 | Kim et al. | 365/230.03 |
| 5,381,538 A | 1/1995 | Amini et al. | 395/425 |
| 5,384,745 A | 1/1995 | Konishi et al. | 365/230.03 |
| 5,386,385 A | 1/1995 | Stephens, Jr. | 365/189.05 |
| 5,390,149 A | 2/1995 | Vogley et al. | 365/189.01 |
| 5,392,239 A | 2/1995 | Margulis et al. | 365/189.01 |
| 5,404,338 A | 4/1995 | Murai et al. | 365/233 |
| 5,404,463 A | 4/1995 | McGarvey | 395/325 |
| 5,422,858 A | 6/1995 | Mizukami et al. | 365/233 |
| 5,444,667 A | 8/1995 | Obara et al. | 365/233 |
| 5,455,803 A | 10/1995 | Kodama | 365/233 |
| 5,475,690 A | 12/1995 | Burns et al. | 370/105.3 |
| 5,504,874 A | 4/1996 | Galles et al. | 395/472 |
| 5,511,024 A | 4/1996 | Ware | 365/189.04 |
| 5,530,623 A | 6/1996 | Sanwo et al. | 361/788 |
| 5,533,204 A | 7/1996 | Tipley | 395/288 |
| 5,548,786 A | 8/1996 | Amini et al. | 395/842 |
| 5,553,248 A | 9/1996 | Melo et al. | 395/296 |
| 5,577,236 A | 11/1996 | Johnson et al. | 395/551 |
| 5,578,940 A | 11/1996 | Dillon | 326/30 |
| 5,579,352 A | 11/1996 | Llewellyn | 375/376 |
| 5,606,717 A | 2/1997 | Farmwald | 395/856 |
| 5,611,058 A | 3/1997 | Moore et al. | 395/309 |
| 5,615,358 A | 3/1997 | Vogley | 395/556 |
| 5,638,531 A | 6/1997 | Crump et al. | 395/450 |
| 5,649,161 A | 7/1997 | Andrade et al. | 395/494 |
| 5,655,113 A | 8/1997 | Leung et al. | 395/552 |
| 5,663,661 A | 9/1997 | Dillon | 326/30 |
| 5,680,361 A | 10/1997 | Ware | 365/230.01 |
| 5,708,297 A | 1/1998 | Clayton | 257/723 |
| 5,742,798 A | 4/1998 | Goldrian | 395/551 |
| 5,748,914 A | 5/1998 | Ware | 395/285 |
| 5,764,963 A | 6/1998 | Ware | 395/507 |
| 5,778,419 A | 7/1998 | Hansen et al. | 711/112 |
| 5,796,624 A | 8/1998 | Sridhar et al. | 364/489 |
| 5,844,855 A | 12/1998 | Ware | 365/230.01 |
| 5,867,541 A | 2/1999 | Tanaka et al. | 375/354 |
| 5,880,998 A | 3/1999 | Tanimura et al. | 365/189.05 |
| 5,892,981 A | 4/1999 | Wiggers | 395/878 |
| 5,928,343 A | 7/1999 | Farmwald | 710/104 |
| 5,933,379 A | 8/1999 | Park et al. | 365/201 |
| 5,943,573 A | 8/1999 | Wen | 438/275 |
| 5,952,691 A | 9/1999 | Yamaguchi | 257/316 |
| 5,987,576 A | 11/1999 | Johnson et al. | 711/167 |
| 6,005,776 A | 12/1999 | Holman et al. | 361/760 |
| 6,016,282 A | 1/2000 | Keeth | 365/233 |
| 6,034,878 A | 3/2000 | Osaka et al. | 365/52 |
| 6,049,238 A | 4/2000 | Shimizu et al. | 327/156 |
| 6,049,467 A | 4/2000 | Tamarkin et al. | 361/790 |
| 6,065,092 A | 5/2000 | Roy | 711/5 |
| 6,067,594 A | 5/2000 | Perino | 710/126 |
| 6,075,393 A | 6/2000 | Tomita et al. | 327/153 |
| 6,075,730 A | 6/2000 | Anderson | 365/191 |
| 6,088,774 A | 7/2000 | Gillingham | 711/167 |
| 6,111,757 A | 8/2000 | Dell et al. | 361/737 |
| 6,125,419 A | 9/2000 | Umemura et al. | 710/129 |
| 6,131,149 A | 10/2000 | Lu et al. | 711/167 |
| 6,154,417 A | 11/2000 | Kim | 365/233 |
| 6,154,821 A | 11/2000 | Barth | 711/170 |
| 6,160,754 A | 12/2000 | Suh | 365/233 |
| 6,172,895 B1 | 1/2001 | Brown et al. | 365/6.3 |
| 6,185,644 B1 | 2/2001 | Farmwald | 710/102 |
| 6,226,723 B1 | 5/2001 | Gustavson et al. | 711/170 |
| 6,232,792 B1 | 5/2001 | Starr | 326/30 |
| 6,233,157 B1 | 5/2001 | Yoon | 361/760 |
| 6,253,266 B1 | 6/2001 | Ohanian | 710/102 |
| 6,260,097 B1 | 7/2001 | Horowitz | 710/129 |
| 6,266,285 B1 | 7/2001 | Farmwald | 365/194 |
| 6,266,730 B1 | 7/2001 | Perino | 710/126 |
| 6,266,737 B1 | 7/2001 | Ware | 711/105 |
| 6,279,090 B1 | 8/2001 | Manning | 711/167 |
| 6,292,877 B1 | 9/2001 | Ryan | 711/169 |
| 6,292,903 B1 | 9/2001 | Coteus et al. | 713/401 |
| 6,304,937 B1 | 10/2001 | Farmwald | 710/129 |
| 6,314,051 B1 | 11/2001 | Farmwald | 365/233 |
| 6,321,282 B1 | 11/2001 | Horowitz | 710/104 |
| 6,336,205 B1 | 1/2002 | Kurokawa et al. | 716/2 |
| 6,343,352 B1 | 1/2002 | Davis | 711/158 |
| 6,356,260 B1 | 3/2002 | Montalbo | 345/204 |
| 6,359,815 B1 | 3/2002 | Sato et al. | 365/198 |
| 6,388,886 B1 | 5/2002 | Tobita | 361/760 |
| 6,401,167 B1 | 6/2002 | Barth | 711/106 |
| 6,442,644 B1 | 8/2002 | Gustavson et al. | 711/105 |
| 6,445,624 B1 | 9/2002 | Janzen et al. | 365/191 |
| 6,449,159 B1 | 9/2002 | Haba | 361/707 |
| 6,449,727 B1 | 9/2002 | Toda | 713/401 |
| 6,477,592 B1 | 11/2002 | Chen et al. | 710/52 |
| 6,493,789 B2 | 12/2002 | Ware | 711/105 |
| 6,496,897 B2 | 12/2002 | Ware | 711/105 |
| 6,502,161 B1 | 12/2002 | Perego | 711/5 |
| 6,504,790 B1 | 1/2003 | Wolford | 365/233 |
| 6,510,503 B2 | 1/2003 | Gillingham et al. | 711/167 |
| 6,516,365 B2 | 2/2003 | Horowitz | 710/104 |
| 6,526,469 B1 | 2/2003 | Drehmel et al. | 710/306 |
| 6,539,454 B2 | 3/2003 | Mes | 711/105 |
| 6,545,875 B1 | 4/2003 | Perino | 361/760 |
| 6,553,472 B2 | 4/2003 | Yang et al. | 711/167 |
| 6,590,781 B2 | 7/2003 | Kollipara | 361/760 |
| 6,611,905 B1 | 8/2003 | Grundon et al. | 711/167 |
| 6,618,736 B1 | 9/2003 | Menage | 707/204 |
| 6,640,292 B1 | 10/2003 | Barth | 711/168 |
| 6,643,752 B1 | 11/2003 | Donnelly | 711/167 |
| 6,643,787 B1 | 11/2003 | Zerbe | 713/400 |
| 6,646,953 B1 | 11/2003 | Stark | 365/233 |
| 6,657,871 B2 | 12/2003 | Perino | 361/760 |
| 6,675,272 B2 | 1/2004 | Ware | 711/167 |
| 6,680,866 B2 | 1/2004 | Kajimoto | 365/189.01 |
| 6,681,288 B2 | 1/2004 | Ware | 711/105 |
| 6,684,263 B2 | 1/2004 | Horowitz | 710/8 |
| 6,724,666 B2 | 4/2004 | Janzen et al. | 365/191 |
| 6,760,857 B1 | 7/2004 | Lau | 713/500 |

| | | | |
|---|---|---|---|
| 6,765,800 B2 | 7/2004 | Haba | 361/760 |
| 6,788,594 B2 | 9/2004 | Ware | 365/194 |
| 6,804,764 B2 | 10/2004 | LaBerge et al. | 711/170 |
| 6,807,614 B2 | 10/2004 | Chung | 711/168 |
| 6,833,984 B1 | 12/2004 | Belgacem | 361/58 |
| 6,839,266 B1 | 1/2005 | Ware | 365/69 |
| 6,853,557 B1 | 2/2005 | Haba | 361/760 |
| 6,873,939 B1 | 3/2005 | Zerbe | 702/189 |
| 6,898,085 B2 | 5/2005 | Haba | 361/760 |
| 6,912,680 B1 | 6/2005 | Keeth | 714/736 |
| 6,928,571 B1 | 8/2005 | Bonnella et al. | 713/401 |
| 6,940,782 B2 | 9/2005 | Matsui | 365/233 |
| 6,950,956 B2 | 9/2005 | Zerbe | 713/400 |
| 6,970,988 B1 | 11/2005 | Chung | 711/168 |
| 7,057,948 B2 | 6/2006 | Shimizu et al. | 365/200 |
| 7,076,745 B2 | 7/2006 | Togo | 716/1 |
| 7,095,661 B2 | 8/2006 | Osaka et al. | 365/194 |
| 7,100,066 B2 | 8/2006 | Jeong | 713/500 |
| 7,224,595 B2 | 5/2007 | Dreps et al. | 365/63 |
| 7,251,162 B2 | 7/2007 | Kawajiri et al. | 365/185.18 |
| 7,548,601 B2 | 6/2009 | Sidiropoulos | 375/371 |
| 2001/0026487 A1 | 10/2001 | Koga | 365/202 |
| 2001/0047450 A1 | 11/2001 | Gillingham et al. | 711/105 |
| 2002/0021616 A1 | 2/2002 | Keeth et al. | 365/233 |
| 2002/0174311 A1 | 11/2002 | Ware | 711/167 |
| 2003/0047757 A1 | 3/2003 | Kumazaki et al. | 257/200 |
| 2003/0076702 A1 | 4/2003 | Kyung et al. | 365/51 |
| 2003/0112677 A1 | 6/2003 | Lehmann et al. | 365/203 |
| 2003/0117864 A1 | 6/2003 | Hampel | 365/200 |
| 2004/0003194 A1 | 1/2004 | Bodas et al. | 711/167 |
| 2004/0054845 A1 | 3/2004 | Ware | 711/100 |
| 2004/0170072 A1 | 9/2004 | Ware | 365/200 |
| 2005/0169097 A1 | 8/2005 | Ware | 365/233 |
| 2006/0007761 A1 | 1/2006 | Ware | 365/194 |
| 2006/0039174 A1 | 2/2006 | Ware | 365/63 |
| 2006/0056244 A1 | 3/2006 | Ware | 365/194 |
| 2006/0069895 A1 | 3/2006 | Ware | 711/167 |
| 2006/0077731 A1 | 4/2006 | Ware | 365/194 |
| 2006/0129776 A1 | 6/2006 | Ware | 711/167 |
| 2009/0251987 A1 | 10/2009 | Macri | 365/233.11 |

FOREIGN PATENT DOCUMENTS

| | | |
|---|---|---|
| EP | 0709786 A1 | 5/1996 |
| EP | 0735492 A1 | 10/1996 |
| EP | 0 849 685 A2 | 6/1998 |
| JP | 2008227394 A | 9/1996 |
| JP | 11-167515 | 6/1999 |
| JP | 11284126 A | 10/1999 |
| JP | 2000035831 A2 | 2/2000 |
| JP | 2000174505 | 6/2000 |
| JP | 2000348490 A | 12/2000 |
| JP | 2001-027918 | 1/2001 |
| WO | WO 9815897 | 4/1998 |
| WO | WO9941667 A1 | 8/1999 |
| WO | WO 9946687 | 9/1999 |
| WO | WO9950852 A1 | 10/1999 |
| WO | WO 00/54164 A1 | 9/2000 |

OTHER PUBLICATIONS

Ware, Frederick re U.S. Appl. No. 12/757,035, filed Apr. 8, 2010 re Notice of Allowance and Fee(s) Due with mail date of Jan. 19, 2011 includes Notice of References cited and Information Disclosure Statements. 26 Pages.

Ware, Frederick re U.S. Appl. No. 12/757,035, filed Apr. 8, 2010 re Information Disclosure Statement dated Apr. 18, 2011. 3 Pages.

Ware, Frederick re U.S. Appl. No. 12/757,035, filed Apr. 8, 2010 re Notice of Allowance and Fee(s) Due dated Jul. 1, 2011 includes Information Disclosure Statement. 15 Pages.

Ware, Frederick re U.S. Appl. No. 12/757,035, filed Apr. 8, 2010 re Office Action dated Sep. 22, 2011 includes Information Disclosure Statement. 4 Pages.

Poulton, John, "Signaling in High Performance Memory Systems", IEEE Solid State Circuits Conference, slides 1-59 on 30 pages (Feb. 1999).

IBM, Micron Technology and Reliance Computer Corporation, DDR SDRAM Registered DIMM Design Specification, Revision 0.6, Nov. 1999, 62 pages.

Nakase, Yasunobu, et al., "Source-Synchronization and Timing Vernier Techniques for 1.2 GB/s SLDRAM Interface," IEEE Journal of Solid-State Circuits, vol. 34, No. 4, Apr. 1999, pp. 494-501.

Wong Derek., et al., "Inserting Active Delay Elements to Achieve Wave Pipelining," IEEE 1989, p. 270-273.

Paris et al., "WP 24.3: A 800 MB/s 72 Mb SLDRAM with Digitally-Calibrated DLL," ISSCC, 0-7803-5129-0/99, 10 pages. Slide Supplement, IEEE, 1999.

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.

Gillingham, Peter and Vogley, Bill, "SLDRAM: High Performance Open-Standard Memory," IEEE Micro, Nov./Dec. 1997, p. 29-39, vol. 17, No. 6, Institute of Electrical and Electronics Engineers, Inc., Los Alamitos, California.

SLDRAM Inc., "SLD4M18DR400 4 MEG×18 SLDRAM: 400 Mb/s/pin SLDRAM 4 M×18 SLDRAM Pipelined, Eight Bank, 2.5 V Operation," Jul. 9, 1998, pp. 1-69, SLDRAM, Inc. San Jose, California. 69 pages.

Gillingham, Peter, "SLDRAM Architectural and Functional Overview," SLDRAM Consortium, Aug. 29, 1997, pp. 1-14.

Yoo, Changsik, DRAM Design 3, Samsung Electronics, High Speed DRAM Interface, Dec. 2001, 35 pages.

Rambus Inc., "8/9-Mbit (1M×8/9) & 16/18Mbit (2M×8/9) RDRAM—Preliminary Information," Rambus Inc. Data Sheet, Mar. 1, 1996, 30 pages.

IEEE Standard for Scalable Coherent Interface (SCI), "Microprocessor and Microcomputer Standards Subcommittee of the IEEE Computer Society", IEEE Std 1596-1992, Aug. 2, 1993.

Seibert, Mike, DRAM Memory Enabling, Micron Technology, Inc., Competitive DDR Memory Sub-Systems, Platform Conference, Jul. 18-19, 2000, 67 pages.

Rambus Inc., Direct Rambus Short Channel Layout Guide, Version 0.8, Mar. 2000, 33 pages.

Samsung Electronics Inc., "KMM377S1620CT2 SDRAM Module Datasheet," Rev. 1 (Nov. 1998), Preliminary, pp. 1-12. 12 pages.

Rambus Inc., Rambus RIMM Module (with 64/72Mb RDRAMs) Data Sheet, Preliminary Information, Document DL0078 Version 0.90, Mar. 1999, pp. 1-11.

Rambus Inc., Rambus SO-RIMM Module (with 128/144Mb RDRAMs), Advance Information Document DL0076 Version 0.7, Feb. 2000, pp. 1-12.

Rambus Direct RAC Data Sheet, Last Modified Aug. 7, 1998, pp. 1-46.

Kim, Y.R., Memory Product Planning and Application, Samsung Electronics, DDR, Today and Tomorrow, Platform Conference, Jul. 18-19, 2000, 26 pages.

Wang et al., 2001, "A 500-Mb/s quadruple data rate SDRAM interface using a skew cancellation technique," IEEE Journal of Solid-State Circuits, 36:648-657.

The Institute of Electrical and Electronics Engineers: "Standard for High-Bandwith Memory Interface Based on Scalable Coherent Interface Signaling Technology (RamLink)" Mar. 19, 1996, IEEE STD 1596.4-1996, XP002315223 pp. 12, 43-45. 5 pages.

IBM, "184 Pin DIMM Design Updates/Ramifications for Unbuffered and Registered DDR DIMMs," JC-42.5, Dec. 1999, p. 1-12.

Exhibit 26: Yang et al., "A Scalable 32Gb/s Parallel Data Transceiver with On-Chip Timing Calibration Circuits," IEEE International Solid State Circuits Conference, pp. 258-259, 2000. 2 pages.

IBM Corp., Application Note, Direct Rambus Memory System Overview, Mar. 30, 1998, pp. 1-5.

Rambus, Inc., Rambus RIMM Connector, Document DL 0069 Version 1.01, Jul. 1999, 14 pages.

International Search Report and Written Opinion of the International Searching Authority in International Application PCT/US2005/032346, ISA European Patent Office, Apr. 18, 2006, 11 pgs.

European Search Report and Written Opinion in European Patent Application 02009032.0-2212, search completed Jun. 27, 2005, 9 pgs.

European Search Report and Written Opinion for EP 1 653374 A3 (Application No. 05022021.9), Jul. 26, 2006, 6 pgs.

Crisp, Richard "Direct Rambus Technology: The New Main Memory Standard," IEEE Micro, Nov./Dec. 1997, pp. 18-28, 0272-1732/97.

Ware, Frederick, Rambus, Inc. Data Sheet "Direct RDRAM 256/288-Mbit (1M×16/18×16d)" Preliminary Information, Document DL00105 Version 1.1, 72 pages; copyright Aug. 1999. 72 pages.

International Preliminary Report on Patentability and Written Opinion of the International Searching Authority in International Application PCT/US2005/032346, European Patent Office, Mar. 29, 2007, 10 pages.

International Preliminary Report and Written Opinion of the International Searching Authority in International Application PCT/US/2005/032770, World Intellectual Property Organization, Apr. 12, 2007, 6 pages.

International Search Report and Written Opinion of the International Searching Authority in International Application PCT/US2005/042722, World Intellectual Property Organization, May 10, 2006, 15 pages.

Yeung et al., 2000, "A 2.4 Gb/s/pin Simultaneous Bidirectional Parallel Link with Per-Pin Skew Compensation," IEEE Journal of Solid-State Circuits, vol. 35, No. 11:1619-1627.

Notice of Opposition with mail date of Apr. 8, 2008 re European Patent No. 1291778; Application No. 02009032.0; 23 pages.

Translation of Notice of Reasons for Rejection for Japanese Patent Application No. 2008-027486 mailed Jan. 9, 2009. 9 pages.

EP Communication dated Jan. 5, 2011 for EP Application No. 10176311.8 re extended European Search Report. 9 Pages.

EP Extended Search Report with mail date of Jan. 5, 2011 re EP Application No. 10177771.2. 8 Pages.

EP Office Action dated Feb. 14, 2011 re EP Application No. 05797483.4. 6 Pages.

EP Extended Search Report dated Feb. 7, 2011 re EP Application No. 10175885.2. 7 pages.

Submission to European Patent Office of Apr. 18, 2011 regarding European Application No. 05797483.4-1229, including remarks in response to Official Communication, new claims with highlighted amendment, and new description p. 41. 12 pages.

EP Response dated Jul. 12, 2011 to the Official Communication dated Feb. 7, 2011 and to the European Search Opinion dated Jan. 5, 2011 for EP Application No. 10176311.8-1229. 32 Pages.

EP Response dated Jul. 15, 2011 to the Official Communication dated Feb. 7, 2011 and to the European Search Opinion dated Jan. 5, 2011 re EP Application No. 10177771.2-1229. 23 Pages.

EP Response dated Aug. 26, 2011 to the Official Communication dated Mar. 14, 2011 and to the European Search Opinion dated Feb. 7, 2011 re EP Application No. 10175885.2-1229. 15 Pages.

EP Office Action dated Feb. 21, 2012 re EP Application No. 05797483.4. 8 pages.

EP Office Action dated Feb. 21, 2012 re EP Application No. 10175885.2. 5 pages.

EP Office Action dated Feb. 21, 2012 re EP Application No. 10177771.2. 8 pages.

EP Office Action dated Feb. 21, 2012 re EP Application No. 10176311.8. 9 pages.

MEMORY COMPONENT HAVING A WRITE-TIMING CALIBRATION MODE

CROSS-REFERENCE TO RELATED APPLICATIONS

This application is a division of U.S. patent application Ser. No. 12/757,035 filed Apr. 8, 2010 now U.S. Pat. No. 8,045,407 and entitled "Memory-Write Timing Calibration Including Generation of Multiple Delayed Timing Signals," which is a division of U.S. patent application Ser. No. 12/246,415 filed Oct. 6, 2008 and entitled "Memory Controller with Multiple Delayed Timing Signals" (now U.S. Pat. No. 7,724,590), which is a division of U.S. patent application Ser. No. 11/746,007 filed May 8, 2007 and entitled "Memory Component with Multiple Delayed Timing Signals" (now U.S. Pat. No. 7,480,193), which is a continuation of U.S. patent application Ser. No. 10/942,225 filed Sep. 15, 2004 and entitled "Memory Systems with Variable Delays for Write Data Signals" (now U.S. Pat. No. 7,301,831). Each of the above-referenced U.S. patent applications is hereby incorporated by reference.

FIELD OF THE INVENTION

The disclosure herein relates generally to memory systems and methods. In particular, this disclosure relates to systems and methods for transferring information among memory components and a memory controller.

BACKGROUND

High-speed processor-based electronic systems have become all-pervasive in computing, communications, and consumer electronic applications to name a few. The pervasiveness of these systems, many of which are based on multi-gigahertz processors, has led in turn to an increased demand for high performance memory systems. As one example, FIG. 8 is a block diagram of a high performance memory system 800 under the prior art. This memory system 800 includes a memory controller 802 coupled to one or more memory component(s) 804. The memory controller 802 includes address circuitry 812 to drive address/control information outputs and write data circuitry 822 to drive write data information outputs to the memory component(s) 804.

Information is carried on signal paths between the memory controller 802 and the memory component(s) 804 by a signal, where the signal includes a symbol (such as a bit) that propagates along the signal path. The symbol is present at a particular point on the signal path for a characteristic time, called the symbol interval or symbol time. A signal path is typically composed of a conductive interconnect. A signal path may use one or two (or more) interconnects to encode the signal, along with return paths through adjacent power conductors.

The memory system 800 uses a variety of signals to couple the memory controller 802 and the memory component(s) 804. One set of signals are address/control signals A and the corresponding timing signals TA (also referred to as address/control timing signals TAX). The address/control signals A carry address and control information, and are labeled as A0, A1, and A2 to show the address/control signals at different points along the signal path between the memory controller 802 and the memory component(s) 804. The timing signals TA carry timing information that indicates when information is valid on the address/control signals A. The timing signals are labeled as TA0, TA1, and TA2 to show the timing signals at different points along the signal path between the memory controller 802 and the memory component(s) 804.

Another set of signals that couple the memory controller 802 and the memory component(s) 804 are write data signals W and the corresponding data valid or timing signals TW (also referred to as write data valid signals or write data timing signals TW). The write data signals W carry write data information, and are labeled as W0, W1, and W2 to show the write data signals at different points along the signal path between the memory controller 802 and the memory component(s) 804. The timing signals TW carry timing information that indicates when information is valid on the write data signals W. The timing signals are labeled as TW0, TW1, and TW2 to show the timing signals at different points along the signal path between the memory controller 802 and the memory component(s) 804. Note that the label for address/control timing signal TA0 is shortened to T0 in the memory system 800, and likewise, the label for write data timing signal TW0 is shortened to T0 because the address circuitry 812 and the write data circuitry 822 operate within a common timing domain in the memory controller 802.

The timing signals TA and TW carry timing information in the form of events, such as a transition between two symbol values (such as a rising edge). A timing signal indicates when valid information is present on a set of related signals. Each timing event may be related to one symbol on each signal of the set, or it may be related to more than one symbol on each signal. The timing signal may only have timing events when there are valid symbols on the associated set of signals, or it may have timing events when there are no valid symbols. Consequently, each bit on the address/control signal A is associated with a timing event on the corresponding address timing signal TA (a rising edge for example). Similarly, each bit on the write data signal W is associated with a timing event on the write data timing signal TW.

The address and control information A2 is received at the memory component(s) 804 with the timing signal TA2, and is coupled to the core circuitry 814 of the memory component(s) 804. This core circuitry 814 operates in the TA2 timing domain. The TA2 timing domain is delayed from the T0 timing domain of the memory controller 802 by the propagation delay time $t_{PD-A}$ (the time required by the signals at A1 and TA1 to propagate to A2 and TA2, respectively).

Further, the write data information W2 is received at the write circuitry 824 of the memory component(s) 804 with the timing signal TW2. The write circuitry 824 operates in the TW2 timing domain, where the TW2 timing domain is delayed from the T0 timing domain of the memory controller 802 by the propagation delay time $t_{PD-W}$ (the time required by the signals at W1 and TW1 to propagate to W2 and TW2, respectively).

In writing data to the core circuitry 814 of the memory component 804, write data received at the write circuitry 824 (TW2 timing domain) must be transferred to the core circuitry 814 (TA2 timing domain). This transfer is accomplished by the interface circuitry 834, where the interface circuitry 834 compensates for timing differences between the TW2 timing domain and the TA2 timing domain (determined by taking the difference between $t_{PD-A}$ and $t_{PD-W}$ propagation delay times). The interface circuitry 834 typically compensates for timing differences between the TW2 timing domain and the TA2 timing domain of approximately $+/-t_{DQSS}$ (data sheet term representing system offsets and pin-to-pin offsets in a dynamic random access memory (DRAM)). Therefore, if the value of $t_{DQSS}$ is made large, it relaxes the signal path matching constraints imposed on $t_{PD-A}$ and $t_{PD-W}$, but increases the burden on the interface circuitry 834 to resolve timing discrepancies between the different timing domains.

If however the value of $t_{DQSS}$ is reduced in order to reduce the burden on the interface circuitry 834, it increases the signal path matching constraints imposed on $t_{PD-A}$ and $t_{PD-W}$. Typically, the A and TA signal paths must be routed together and matched relatively tightly so the timing information on TA can be used to reliably sample the address and control information on the A signals. Similarly, the W and TW signal paths must be routed together and matched relatively tightly so the timing information on TW can be used to reliably sample the address and control information on the W signals. Thus, if the $t_{DQSS}$ value is made small, the $t_{PD-A}$ and $t_{PD-W}$ values of all the A/TA and W/TW signals must be simultaneously matched.

FIG. 9 is a timing diagram 900 showing signals for a write operation in the memory system 800 under the prior art. Address/control information, "addr," is placed on the address/control signal A0 by the memory controller in response to the first rising edge of the T0 timing signal. The address/control signal A0 is then driven onto the signal path as the A1 signal along with a rising edge of the corresponding TA1 signal. The A1 and TA1 signals propagate to the core circuitry of the memory component and become the A2 and TA2 signals at time $t_{PD-A}$ later.

Additionally, write data is placed on the write data signal W0 by the memory controller in response to the first rising edge of the T0 timing signal. The write data signal W0 is held in the memory controller for a time $t_{WL}$ (where $t_{WL}$ is a fixed delay of two (2) cycles or periods for example) before being driven onto the W1 signal (along with a rising edge of the corresponding TW1 signal). The W1 and TW1 signals propagate to the write circuitry of the memory component and become the W2 and TW2 signals at time $t_{PD-W}$ later.

The write operation in the memory system 800 results in a mismatch between the timing of the TA2 and TW2 timing signals at the memory component(s). In order for the interface circuitry to compensate for this timing mismatch, the magnitude of the mismatch must not exceed the difference between the value $t_{DQSS}$ and the value $t_{WL}$ (the quantity ($t_{DQSS}$-$t_{WL}$)); when the mismatch exceeds the difference between the value $t_{DQSS}$ and the value $t_{WL}$ the write data cannot be reliably transferred from the write circuitry to the core circuitry within the memory component. Consequently, there is a need in high performance memory systems to increase the reliability and accuracy of data writes to memory components while relaxing the signal path matching constraints (relating to the $t_{PD-A}$ and $t_{PD-W}$ values) and reducing the burden on the interface circuitry.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the Figure number in which that element is first introduced (e.g., element 150 is first introduced and discussed with respect to FIG. 1).

DETAILED DESCRIPTION

Systems and methods for generating write data signals having variable delays for use in writing data to memory components are provided below. These systems and methods, also referred to herein as variable delay write circuitry, receive a write data signal and a corresponding data valid or timing signal (also referred to as a write data valid signal or write data timing signal) and in turn generate multiple delayed versions of the write data signals and delayed valid signals. The memory system selects one of these delayed write data signals and delayed data valid signals for use in writing data to memory components.

In operation the variable delay write circuitry receives a write data signal and a corresponding data valid signal, and uses circuitry including register storage elements and calibrated delay elements to generate delayed write data signals and delayed valid signals with variable delays. The write data signal and the corresponding multiple delayed write data signals include data to be transferred to the memory components during a write operation. The data valid signal and corresponding delayed valid signals indicate when data of the write data signal is valid. The variable delays of the delayed write data signals and delayed valid signals of an embodiment are in a range of approximately 1.00 to 2.75 clock periods or cycles, but are not so limited.

The variable delay write circuitry selects one of the delayed write data signals and one of the delayed valid signals for output. Each of the selected output signals has a delay that best compensates for the mismatch of the propagation delay values resulting from differences in the signal paths used to couple signals between the variable delay write circuitry and the memory component. In this manner the variable delay write circuitry allows for relaxed signal path matching constraints (propagation delay values) and also reduces the burden on circuitry of the memory component to compensate for misalignment between the timing events of the various received signals. The variable delay write circuitry is for use in memory systems which include, for example, double data rate (DDR) systems like DDR SDRAM as well as DDR2 SDRAM and other DDR SDRAM variants, such as reduced latency DRAM (RLDRAM), RLDRAM2, Graphics DDR (GDDR) and GDDR2, GDDR3, but is not limited to these memory systems.

In the following description, numerous specific details are introduced to provide a thorough understanding of, and enabling description for, embodiments of the variable delay write circuitry. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Figure 1:
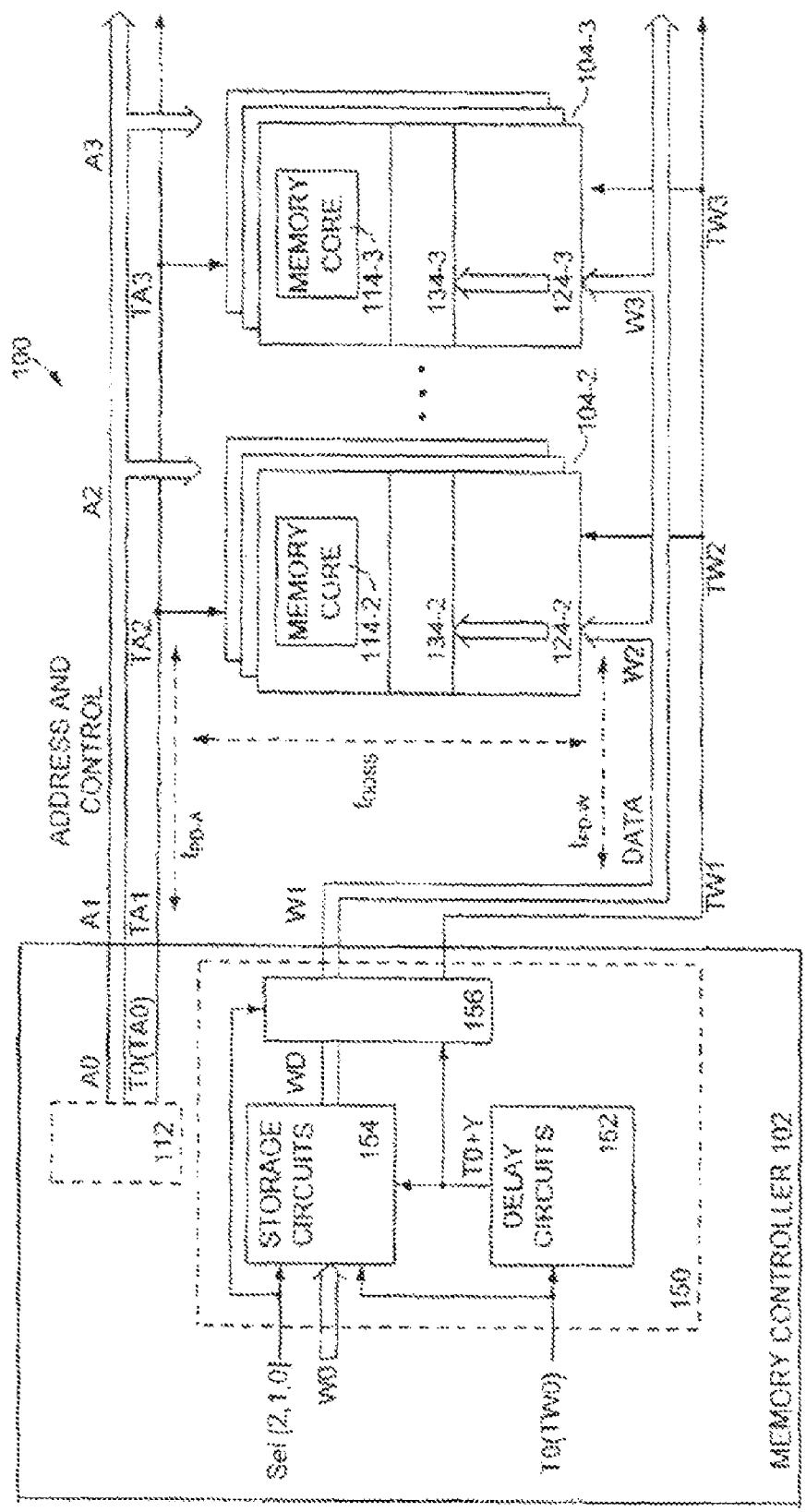
FIG. 1 is a block diagram of a memory system that includes variable delay write circuitry for generating write data signals and data valid signals with variable delays, under an embodiment.

FIG. 1 is a block diagram of a memory system 100 that includes variable delay write circuitry 150 for generating write data signals and data valid signals with variable delays, under an embodiment. This memory system 100 includes a memory controller 102 coupled to one or more memory components 104-2 and 104-3; while two memory components 104-2/104-3 are shown the embodiment is not limited to any number of memory components. The memory system 100 operates in a number of modes including calibration, transmitter, and receiver modes. The memory controller 102 includes address circuitry 112 to drive address/control information to circuits or components that include the memory components 104-2/104-3. The address/control information includes but is not limited to address/control signals A0 and address/control valid signals T0.

The memory controller 102 of an embodiment includes the variable delay write circuitry 150 to drive write data information signals W0 and T0 to the memory components 104-2/104-3. The variable delay write circuitry 150 of an embodiment includes delay circuits 152, storage circuits 154, and output circuits 156, but is not limited to these circuits. The delay circuits 152 receive write data valid signals T0 and in response generate a number of delayed data valid signals T0+Y. The multiple delayed data valid signals T0+Y include delayed versions of the write data valid signals T0, as described below. The delayed data valid signals T0+Y couple to the storage circuits 154 and the output circuits 156, as described below.

The storage circuits 154 of an embodiment couple to receive the delayed data valid signals T0+Y from the delay circuits 152 as well as write data signal W0, data valid signal T0, and control signal Sel[2,1,0]. The storage circuits in turn generate a number of delayed write data signals WD. Each delayed write data signal WD is delayed a period of time in a range of approximately 1.00 to 2.75 clock periods or cycles, as described below, but is not so limited. The delayed write data signals WD couple to the output circuits 156.

The output circuits 156 couple to receive the delayed write data signals WD from the storage circuits 154 and the delayed data valid signals T0+Y from the delay circuits 152. Additionally the output circuits 156 couple to receive the control signal Sel[2,1,0]. The output circuits 156 in response to information of the control signal Sel[2,1,0] select one of the delayed write data signals WD for the transfer of write data information as write data signal W1 to the memory components 104-2/104-3, as described below. Further, the output circuits 156 select one of the delayed data valid signals T0+Y for output to the memory components 104-2/104-3 as write data valid signal TW1 (also referred to as delayed write data valid signal TW1).

Information is carried on signal paths between the memory controller 102 and the memory components 104-2/104-3 by a signal, where the signal includes a symbol that propagates along the signal path. The memory system 100 uses a variety of signals to couple the memory controller 102 and the memory components 104-2/104-3, as described above. One set of signals include address/control signals A and the corresponding valid signals TA (also referred to as address/control valid signals TA). The address/control signals A carry address and control information, and are labeled as A0, A1, and A2 to show the address/control signals at different points along the signal path between the memory controller 102 and the memory components 104-2/104-3. The valid signals TA carry timing information that indicates when information is valid on the address/control signals A. The valid signals are labeled as TA0, TA1, and TA2 to show the valid signals at different points along the signal path between the memory controller 102 and the memory components 104-2/104-3.

Another set of signals that couple the memory controller 102 and the memory components 104-2/104-3 include write data signals W and the corresponding data valid signals TW (also referred to as write data valid signals TW). The write data signals W carry write data information, and are labeled as W0, W1, and W2 to show the write data signals at different points along the signal path between the memory controller 102 and the memory components 104-2/104-3. The data valid signals TW carry timing information that indicates when information is valid on the write data signals W. The valid signals are labeled as TW0, TW1, and TW2 to show the valid signals at different points along the signal path between the memory controller 102 and the memory components 104-2/104-3. Note that the label for address/control timing signal TA0 is shortened to T0 in the memory system 100, and likewise, the label for data valid signal TW0 is shortened to T0 because the address circuitry 112 and the write data circuitry 150 operate within a common timing domain in the memory controller 102.

The valid signals TA and TW carry timing information in the form of events, such as a transition between two symbol values. The transition between two symbol values can include, for example, a falling edge or a rising edge of the signal. A valid signal indicates when valid information is present on a set of related signals. Each timing event may be related to one symbol on each signal of the set, or it may be related to more than one symbol on each signal. The valid signal may only have timing events when there are valid symbols on the associated set of signals, or it may have timing events when there are no valid symbols. Consequently, each bit on the address/control signal A is associated with a timing event on the corresponding address valid signal TA (a rising edge for example). Similarly, each bit on the write data signal W is associated with a timing event on the data valid signal TW.

Alternative embodiments of the memory system described herein associate each rising edge on an address valid signal TA and/or data valid signal TW with two successive bits on each address and control signal A and/or write data signal W signal. Other alternative embodiments of the memory system described herein associate each rising edge and each falling edge on an address valid signal TA and/or data valid signal TW with each successive bit on each address and control signal A and/or write data signal W signal.

Taking one memory component as an example, the address and control signal A2 is received at the memory component 104-2 along with the address valid signal TA2, and is coupled to the core circuitry 114-2 of the memory component 104-2. This core circuitry 114-2 operates in the TA2 timing domain. The TA2 timing domain is delayed from the T0 timing domain of the memory controller 102 by the propagation delay time $t_{PD-A}$ (the time required by the signals at A1 and TA1 to propagate to A2 and TA2, respectively).

Additionally the write data signal W2 is received at the write circuitry 124-2 of the memory component 104-2 with the data valid signal TW2. The write circuitry 124-2 operates in the TW2 timing domain, where the TW2 timing domain is delayed from the T0 timing domain of the memory controller 102 by the propagation delay time $t_{PD-W}$ (the time required by the signals at W1 and TW1 to propagate to W2 and TW2, respectively).

In writing data to the core circuitry 114-2 of the memory component 104-2 during a write operation, write data W2 received at the write circuitry 124-2 (TW2 timing domain) must be transferred to the core circuitry 114-2 (TA2 timing domain). This transfer is accomplished by the interface circuitry 134-2, where the interface circuitry 134-2 compensates for timing differences between the TW2 timing domain and the TA2 timing domain. The timing difference between the timing domains TW2 and TA2 is determined by taking the difference between $t_{PD-A}$ and $t_{PD-W}$ propagation delay times.

The interface circuitry 134-2 typically compensates for timing differences between the TW2 timing domain and the TA2 timing domain of approximately $+/-t_{DQSS}$. During write operations the variable delay write circuitry 150, using information of the control signal Sel[2,1,0], selects one signal of the delayed write data signals WD for transmission to memory component 104-2 as signal W1 and one delayed data valid signal T0+Y for transmission to memory component 104-2 as signal TW1. Each of the selected signals W1 and TW1 has a delay that best compensates for the mismatch of the propagation delay values ($t_{PD-A}$ and $t_{PD-W}$ values) resulting from differences in the respective signal paths that couple the data W1 and valid TW1 signals to the memory component 104-2. In this manner the variable delay write circuitry 150 allows for relaxed signal path matching constraints (for the $t_{PD-A}$ and $t_{PD-W}$ values) while reducing the burden on the interface circuitry to compensate for misalignment between the timing events of the data valid signals TW2 and the corresponding address/control valid signals TA2.

Operation of memory component 104-3 is similar to that of memory component 104-2. The address and control signal A3 is received at the memory component 104-3 along with the address valid signal TA3, and is coupled to the core circuitry 114-3 of the memory component 104-3. This core circuitry 114-3 operates in the TA3 timing domain. The write data signal W3 is received at the write circuitry 124-3 along with the data valid signal TW3. The write circuitry 124-3 operates in the TW3 timing domain. In writing data to the core circuitry 114-3 of the memory component 104-3 during a write operation, write data W3 received at the write circuitry 124-3 (TW3 timing domain) must be transferred to the core circuitry 114-3 (TA3 timing domain). This transfer is accomplished by the interface circuitry 134-3, where the interface circuitry 134-3 compensates for timing differences between the TW3 timing domain and the TA3 timing domain.

Figure 2:
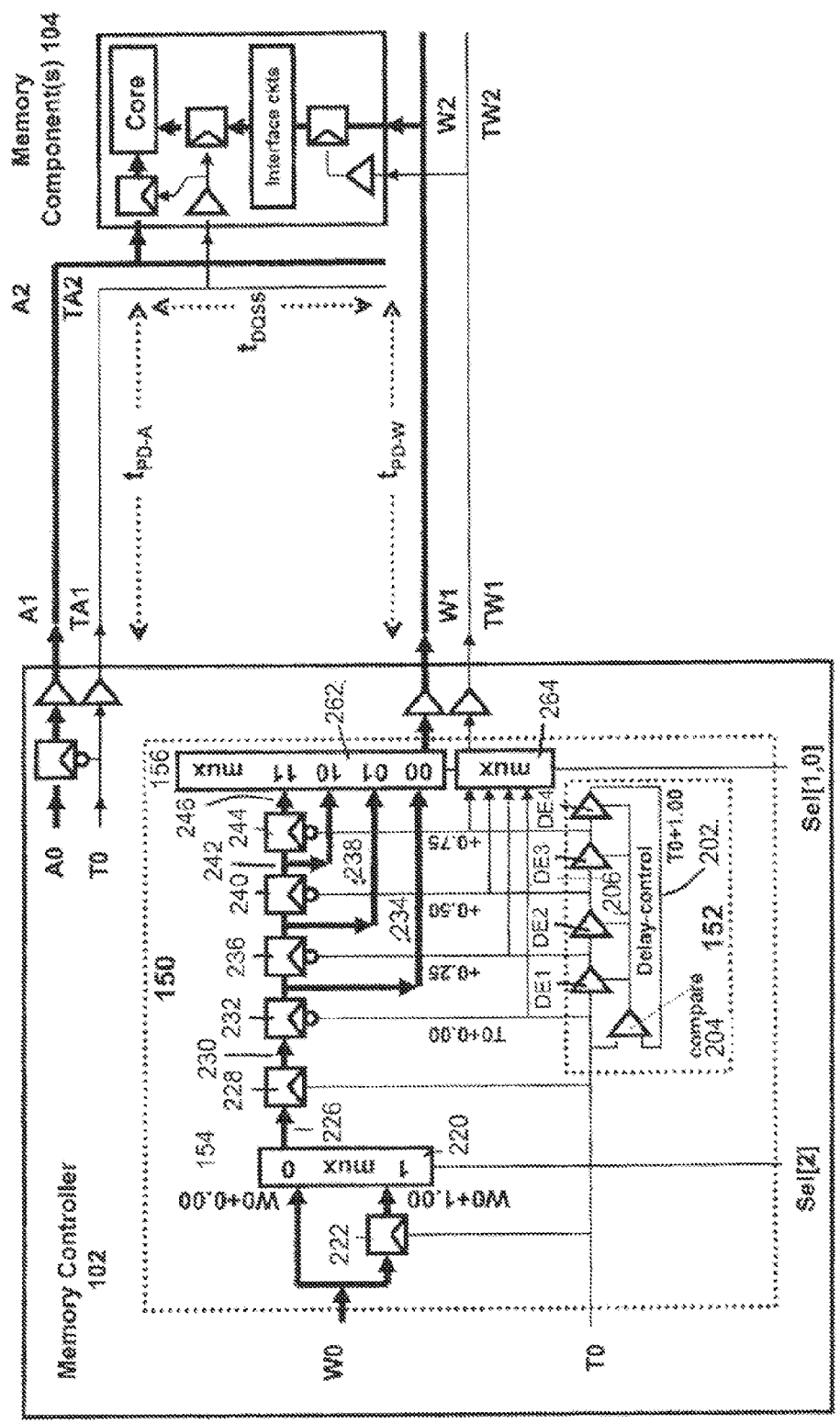
FIG. 2 is another block diagram of the memory system that includes variable delay write circuitry for generating variably delayed write data signals and variably delayed data valid signals, under an embodiment.

FIG. 2 is another block diagram of the memory system 100 that includes variable delay write circuitry 150 for generating variably delayed write data signals W1 and variably delayed data valid signals TW1, under an embodiment. As described above the variable delay write circuitry 150 includes delay circuits 152, storage circuits 154, and output circuits 156. The delay circuits 152 receive write data valid signals T0 and in response generate a plurality of data valid signals T0+Y.

The delay circuits 152 of an embodiment include a delay line 202, a compare circuit or comparator 204, and a delay control signal 206 that function as a delay-locked-loop (DLL) to produce a number of accurate delay signals. The delay line 202 includes four unit delay elements DE1, DE2, DE3, and DE4 coupled in series; alternative embodiments can include any number of unit delay elements. Each unit delay element DE1-DE4 delays the input signal by an amount that is approximately equal to the median delay of the variable delay element DE1-DE4, such as one-fourth of the timing signal period (i.e., 90 degrees), but alternative embodiments will use other delay values.

The first unit delay element DE1 in the series of delay elements couples to receive the write data valid signal T0 as an input. The delay line 202 provides a delayed signal having a total delay that is approximately one period of the write data timing signal T0. Therefore, each of the four unit delay elements DE1-DE4 delays the write data valid signal T0 by an amount that is approximately one-fourth of the write data valid signal T0 period.

The delay line 202 (delayed signal) couples to a first input of the comparator 204 while the write data valid signal T0 (undelayed signal) couples to a second input of the comparator 204. The comparator uses information of a comparison between the write data valid signal T0 and the delayed write data valid signal of the delay line 202 (one clock period delay) to generate the control signal 206. The comparator outputs the control signal 206 for use in controlling delays or timing offsets of one or more of the unit delay elements DE1-DE4. The control signal 206 can be any of a variety of signal types known in the art, such as voltage bias signals, current bias signals, or digital delay-control signals. The offsets of the delay elements DE 1-DE4 are controlled within a pre-specified range in response to variations in operating parameters of the memory system 100.

The delay circuits 152 output four data valid signals that couple to each of the storage circuits 154 and output circuits 156. In addition to outputting the write data valid signal T0 (alternatively referred to herein as T0+0.00), the delay circuits 152 provide three delayed valid signals with delays of +0.25, +0.50, and +0.75 clock periods or cycles of the write data valid signal T0. The output of the first unit delay element DE1 provides the first delayed valid signal with a +0.25 period delay (T0+0.25), the output of the second unit delay element DE2 provides the second delayed valid signal with a +0.50 period delay (T0+0.50), and the output of the third unit delay element DE3 provides the third delayed valid signal with a +0.75 period delay (T0+0.75), but the embodiment is not so limited.

The delay circuits of various alternative embodiments can include one or more phase-locked-loops (PLLs) instead of the DLL to generate the delayed valid signals. The PLLs produce phase-aligned signals having four times the frequency of the write data valid signal, but are not so limited.

The storage circuits 154 of an embodiment include a 2-to-1 multiplexer 220 that couples to receive input signals comprising the write data signal W0 and a delayed write data signal W0+1.00. The multiplexer 220 receives the delayed write data signal W0+1.00 via a coupling with a first register storage element 222. The first register storage element 222 couples to receive and load the write data signal W0 in response to a rising edge on the write data valid signal T0, but is not limited to loading on a rising edge. The first register storage element 222 outputs the delayed write data signal W0+1.00, which is delayed by approximately 1.00 clock period. The delayed write data signal W0+1.00 of alternative embodiments can be delayed by different clock periods.

The multiplexer 220 selects one of the write data signal W0 and the delayed write data signal W0+1.00 as an output data signal 226 in response to information of a control signal Sel[2], as described below. Consequently, the multiplexer 220 provides output data signals 226 having a variable delay of approximately zero (0.00) or 1.00 clock periods or cycles.

The output data signal 226 of the multiplexer couples to an input of a second register storage element 228. The second register storage element 228 receives and loads the output data signal 226 in response to a rising edge on the write data valid signal T0, but is not limited to loading the signal on the rising edge. The second register storage element 228 outputs a delayed write data signal 230 delayed by approximately 1.00 clock period relative to the received data signal 226. The delayed write data signal 230 of alternative embodiments can be delayed by different time periods.

The delayed write data signal 230 output of the second register storage element 228 couples to a series coupling of four register storage elements 232/236/240/244; alternative embodiments can include any number/combination of register storage elements. Each of the series storage elements 232/236/240/244 generally couples to receive and load a delayed write data signal in response to a falling edge of a data valid signal received from the delay circuits 152, but is not limited to loading the signal on the falling edge. Further, each of the series storage elements 232/236/240/244 outputs a delayed write data signal that is delayed relative to its input in accordance with the data valid signal used as the clock signal of the series storage element as described below; alternative embodiments can use different values and/or combinations of delay periods.

For example, the first series storage element 232 of the series couples to receive and load the delayed write data signal 230 from the second register storage element 228 in response to a falling edge on the write data valid signal T0+0.00. The first series storage element 232 outputs a delayed write data signal 234 that is undelayed relative to the delayed write data signal 230. The delayed write data signal 234, which has a delay of either approximately 1.00 or 2.00 clock periods relative to the write data signal W0 (depending on control signal Sel[2]), couples to the input of the second series storage element 236 as well as an input of the output circuitry 156.

The second series storage element 236 of the series couples to receive and load the delayed write data signal 234 from the first series storage element 232 in response to a falling edge on the write data valid signal T0+0.25. The second series storage element 236 therefore outputs a delayed write data signal 238 that is further delayed by one-quarter clock period relative to the delayed write data signal 234. The delayed write data signal 238, which has a delay of either approximately 1.25 or 2.25 clock periods relative to the write data signal W0 (depending on control signal Sel[2]), couples to the input of the third series storage element 240 as well as an input of the output circuitry 156.

The third series storage element 240 of the series couples to receive and load the delayed write data signal 238 from the second series storage element 236 in response to a falling edge on the write data timing valid T0+0.50. The third series storage element 240 thus outputs a delayed write data signal 242 that is further delayed by one-quarter clock period relative to the delayed write data signal 238. The delayed write data signal 242, which has a delay of either approximately 1.50 or 2.50 clock periods relative to the write data signal W0 (depending on control signal Sel[2]), couples to the input of the fourth series storage element 244 as well as an input of the output circuitry 156.

The fourth series storage element 244 of the series couples to receive and load the delayed write data signal 242 from the third series storage element 240 in response to a falling edge on the write data valid signal T0+0.75. The fourth series storage element 244 therefore outputs a delayed write data signal 246 that is further delayed by one-quarter clock period relative to the delayed write data signal 242. The delayed write data signal 246, which has a delay of either approximately 1.75 or 2.75 clock periods relative to the write data signal W0 (depending on control signal Sel[2]), couples to an input of the output circuitry 156.

The output circuitry 156 of an embodiment includes two multiplexers 262 and 264 which, under control of control signal Sel[1,0], allow selection of one of the four delayed versions of the write data signal W0 and one of the four data valid signals T0, respectively, for output to the memory components. A first 4-to-1 multiplexer 262 couples to receive input signals 234/238/242/246 from the storage circuits 154. The input signals 234/238/242/246 include the four delayed versions of the write data signal W0. When the input multiplexer 220 of the storage circuits 154 selects the write data signal W0 as the output data signal 226 in response to information of control signal Sel[2], the input signals 234/238/242/246 have delays of approximately 1.00/1.25/1.50/1.75 periods, respectively. Alternatively, when the input multiplexer 220 of the storage circuits 154 selects the delayed write data signal W0+1.00 as the output data signal 226 in response to information of control signal Sel[2], the input signals 234/238/242/246 have delays of approximately 2.00/2.25/2.50/2.75 periods, respectively. The write data signal selected for output from the first multiplexer 262 is driven onto the write data signal path as variable delay write data signal W1 for transmission to the memory components 104.

A second 4-to-1 multiplexer 264 of the output circuitry 156 couples to receive input signals T0+0.00/T0+0.25/T0+0.50/T0+0.75 from the delay circuits 152. The input signals T0+0.00/T0+0.25/T0+0.50/T0+0.75 include four different versions of the write data valid signal T0. The data valid signal selected for output from the second multiplexer 264 is driven onto the write data signal path as variable delay valid signal TW1 for transmission to the memory components 104.

Figure 3:
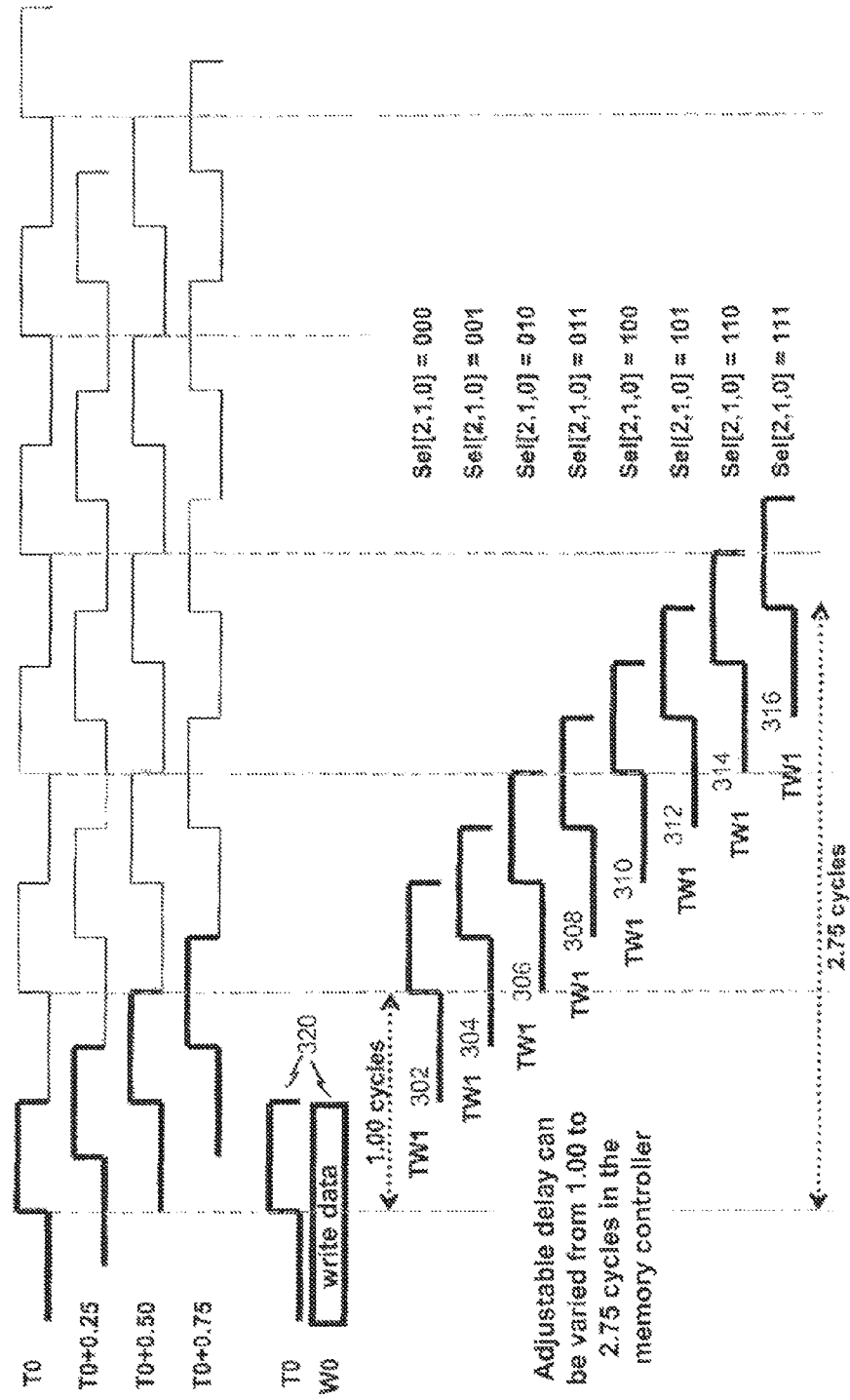
FIG. 3 is a timing diagram showing the delayed data valid along with the corresponding write data valid signals selected for output by the variable delay write circuitry, under an embodiment.

FIG. 3 is a timing diagram 300 showing the delayed data valid signals T0+Y (where "Y" is one of 0.00 (+1.00), +0.25, +0.50, and +0.75) along with the corresponding write data valid signals TW1 selected for output by the variable delay write circuitry, under an embodiment. With further reference to FIG. 2, the delay circuits 152 output the write data valid signal T0 (T0+0.00) along with three delayed data valid signals, as described above. The first delayed data valid signal T0+0.25 has a +0.25 period delay, the second delayed data valid signal T0+0.050 has a +0.50 period delay, and the third delayed data valid signal T0+0.075 has a +0.75 period delay (T0+0.75), but the embodiment is not so limited. The T0+1.00 timing signal will be approximately the same as the T0+0.00 signal, since T0 is periodic in this example.

The write data valid signals T0+Y are used as described above to generate numerous variable delay write data signals for use as data write signal W1. The write data signal W1 is therefore a selectively delayed version of the write data signal W0 which can be selectively delayed in approximately 0.25-period increments over a range of 1.00 to 2.75 periods using the control signal Sel[2,1,0]. Note that only the data valid signal TW1 is shown in the timing diagram 300 to represent each of the eight delayed write data signals because the corresponding write data signal W1 remains centered on the variable delay write data timing signal TW1 in each case (as the relationship is shown with the signal combination W0 relative to T0 320).

The variable delay write circuitry outputs a write data valid signal TW1 302 delayed by approximately 1.00 period when the control signal Sel[2,1,0] includes logic values "000". With further reference to FIG. 2, the first logic value ("0") forms control signal Sel[2] which selects write data signal W0+0.00 as the output of multiplexer 220. The second and third logic values ("00") of control signal Sel[1,0] select the timing signal T0+1.00 as the valid signal TW1 output 302 of multiplexer 264 (it is assumed that the T0 signal is periodic, so that a delay of T0+1.00 is generated using the next timing event (a rising edge in this example); the circuitry to do this is a component of enabling logic that creates timing events on the TW1 signal when the TW1 signal is not periodic). The control signal Sel[1,0] also selects the write data signal 234 (W0+1.00) as the write data signal W1 output from multiplexer 262.

The variable delay write circuitry outputs a write data valid signal TW1 304 delayed by approximately 1.25 periods when the control signal Sel[2,1,0] includes logic values "001". The first logic value ("0") forms control signal Sel[2] which selects write data signal W0+0.00 as the output of multiplexer 220. The second and third logic values ("01") of control signal Sel[1,0] select the timing signal T0+0.25 as the valid signal TW1 output 304 of multiplexer 264 (it is assumed that the T0 signal is periodic, so that a delay of T0+1.25 is generated using the next timing event). The control signal Sel[1,0] also selects the write data signal 238 (W0+1.25) as the write data signal W1 output of multiplexer 262.

The variable delay write circuitry outputs a write data timing signal TW1 306 delayed by approximately 1.50 periods when the control signal Sel[2,1,0] includes logic values "010". The first logic value ("0") forms control signal Sel[2] which selects write data signal W0+0.00 as the output of multiplexer 220. The second and third logic values ("10") of control signal Sel[1,0] select the timing signal T0+0.50 as the valid signal TW1 output 306 of multiplexer 264 (it is assumed that the T0 signal is periodic, so that a delay of T0+1.50 is generated using the next timing event). The control signal Sel[1,0] also selects the write data signal 242 (W0+1.50) as the write data signal W1 output of multiplexer 262.

The variable delay write circuitry outputs a write data timing signal TW1 308 delayed by approximately 1.75 periods when the control signal Sel[2,1,0] includes logic values "011". The first logic value ("0") forms control signal Sel[2] which selects write data signal W0+0.00 as the output of multiplexer 220. The second and third logic values ("11") of control signal Sel[1,0] select the timing signal T0+0.75 as the valid signal TW1 output 308 of multiplexer 264 (it is assumed that the T0 signal is periodic, so that a delay of T0+1.75 is generated using the next timing event). The control signal Sel[1,0] also selects the write data signal 246 (W0+1.75) as the write data signal W1 output of multiplexer 262.

The variable delay write circuitry outputs a write data timing signal TW1 310 delayed by approximately 2.00 periods when the control signal Sel[2,1,0] includes logic values "100". The first logic value ("1") forms control signal Sel[2] which selects write data signal W0+1.00 as the output of multiplexer 220. The second and third logic values ("00") of control signal Sel[1,0] select the timing signal T0+1.00 as the valid signal TW1 output 310 of multiplexer 264 (it is assumed that the T0 signal is periodic, so that a delay of T0+1.00 is generated using the next timing event (a rising edge in this example); the circuitry to do this is a component of enabling logic that creates timing events on the TW1 signal when the TW1 signal is not periodic). The control signal Sel[1,0] also selects the write data signal 234 (W0+2.00) as the write data signal W1 output of multiplexer 262.

The variable delay write circuitry outputs a write data timing signal TW1 312 delayed by approximately 2.25 periods when the control signal Sel[2,1,0] includes logic values "101". The first logic value ("1") forms control signal Sel[2] which selects write data signal W0+1.00 as the output of multiplexer 220. The second and third logic values ("01") of control signal Sel[1,0] select the timing signal T0+0.25 as the valid signal TW1 output 312 of multiplexer 264 (it is assumed that the T0 signal is periodic, so that a delay of T0+1.25 is generated using the next timing event). The control signal Sel[1,0] also selects the write data signal 238 (W0+2.25) as the write data signal W1 output of multiplexer 262.

The variable delay write circuitry outputs a write data timing signal TW1 314 delayed by approximately 2.50 periods when the control signal Sel[2,1,0] includes logic values "110". The first logic value ("1") forms control signal Sel[2] which selects write data signal W0+1.00 as the output of multiplexer 220. The second and third logic values ("10") of control signal Sel[1,0] select the timing signal T0+0.50 as the valid signal TW1 output 314 of multiplexer 264 (it is assumed that the T0 signal is periodic, so that a delay of T0+1.50 is generated using the next timing event). The control signal Sel[1,0] also selects the write data signal 242 (W0+2.50) as the write data signal W1 output of multiplexer 262.

The variable delay write circuitry outputs a write data timing signal TW1 316 delayed by approximately 2.75 periods when the control signal Sel[2,1,0] includes logic values "111". The first logic value ("1") forms control signal Sel[2] which selects write data signal W0+1.00 as the output of multiplexer 220. The second and third logic values ("11") of control signal Sel[1,0] select the timing signal T0+0.75 as the valid signal TW1 output 316 of multiplexer 264 (it is assumed that the T0 signal is periodic, so that a delay of T0+1.75 is generated using the next timing event). The control signal Sel[1,0] also selects the write data signal 246 (W0+2.75) as the write data signal W1 output of multiplexer 262.

As described above, control signals Sel[2,1,0] control selection of a write data signal W1 and the corresponding write data valid signal TW 1 having a delay value appropriate to the signal paths between the memory controller and the memory components. The control signals are provided by one or more control circuits (not shown) that are components of and/or coupled to the memory controller. As an example, the control circuits of one or more embodiments can include one or more programmable registers. The content of the programmable registers, which control selection of the write data signal W1 and corresponding write data valid signal TW1 provided by the variable delay write circuitry, is determined in accordance with several approaches, including both automatic and user-programmable processes.

In one embodiment the content of the programmable registers is determined using information of a calibration process and automatically programmed into the registers of the control circuits. Generally, a calibration process can evaluate and compare the relative propagation delay information of each of the address/control signals and the corresponding write data signals across the respective signal paths. In so doing, the calibration process determines which of the delayed write data signals and delayed write data valid signals is optimal for use in writing data to the memory components. Alternatively, the content of the programmable registers is manually programmed into the registers of the control circuits by a user.

Regarding the calibration process of an embodiment, and taking one memory component as an example, a memory controller or other component of a host system places one or more components of the memory system in a calibration mode. In the calibration mode, the memory controller performs a series of dummy write operations to the memory component during which a number of write operation are performed, with each write operation using a different one of the delayed versions of the write data signal. A dummy write is generally defined to include a process in which a memory controller writes pre-specified data to a memory component, independent of any data needs of components of the memory system or other higher layer machine-readable code; these writes are performed at power-up, or other intervals in which the memory component was otherwise not being utilized.

Following completion of the dummy write operations the memory controller reads the data of all dummy write operations from the memory component and compares the read data with the actual data written to identify successful write operations. Timing information of the successful dummy write operations allows for identification of the particular delayed write data signal providing the best timing margin. The logic values that identify the delayed write data signal providing the best timing margin are then programmed into the programmable registers.

Figure 4:
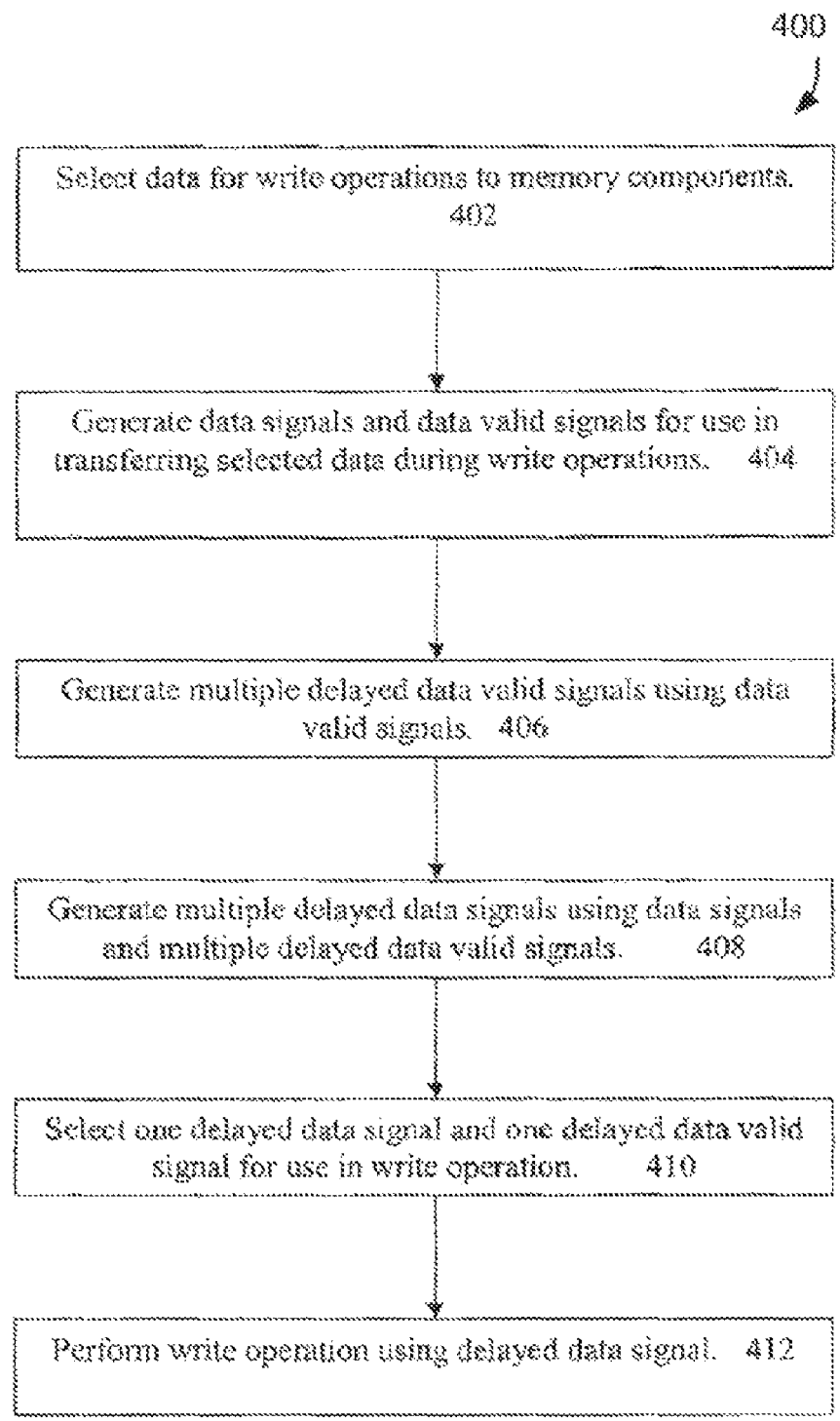
FIG. 4 is a block diagram for generating write data signals and write data valid signals with selectable delays for use in memory write operations, under an embodiment.

Generally the memory system selects a delayed data signal for write operations that minimizes the difference between the propagation delay times of the data signals and the corresponding address/control signals. The propagation delay times are as measured across signal paths between the memory controller and one or more memory components but are not so limited. FIG. 4 is a block diagram 400 for generating write data signals and write data valid signals with selectable delays for use in memory write operations, under an embodiment. Circuitry or components of a memory system, for example a memory controller, select data for write operations to memory components or devices, at block 402. The memory system of an embodiment generates data signals and data valid signals for use in transferring the selected data of the write operation to the memory components via a first signal path, at block 404. The memory system uses the data valid signals to generate delayed data valid signals that include multiple delayed versions of the data valid signal, at block 406, where each delayed data valid signal has a different amount of delay. The memory system, using the delayed data valid signals, generates delayed data signals that include multiple delayed versions of the data signal, at block 408. Each delayed data signal also has a different amount of delay, but the embodiment is not so limited.

During memory write operations, components of the memory system transfer the data signals and data valid signals to the memory components via a first signal path. Additionally, address/control signals and address/control valid signals are generated and transferred to the memory components via a second signal path. Control signals select one of the delayed data signals and one of the delayed data valid signals for use in driving data of the write operations to the memory components, at block 410. Selection of a particular delayed data signal and corresponding delayed data valid signal is in accordance with pre-determined differences in propagation delay times between the first and second signal paths. Thus, the memory system selects the delayed data signal and delayed data valid signal that minimizes the difference between the propagation delay times of the data signals across the first signal path and the address/control signals across the second signal path. The selected data is transferred to the memory components using the delayed data signal, at block 412.

Figure 5:
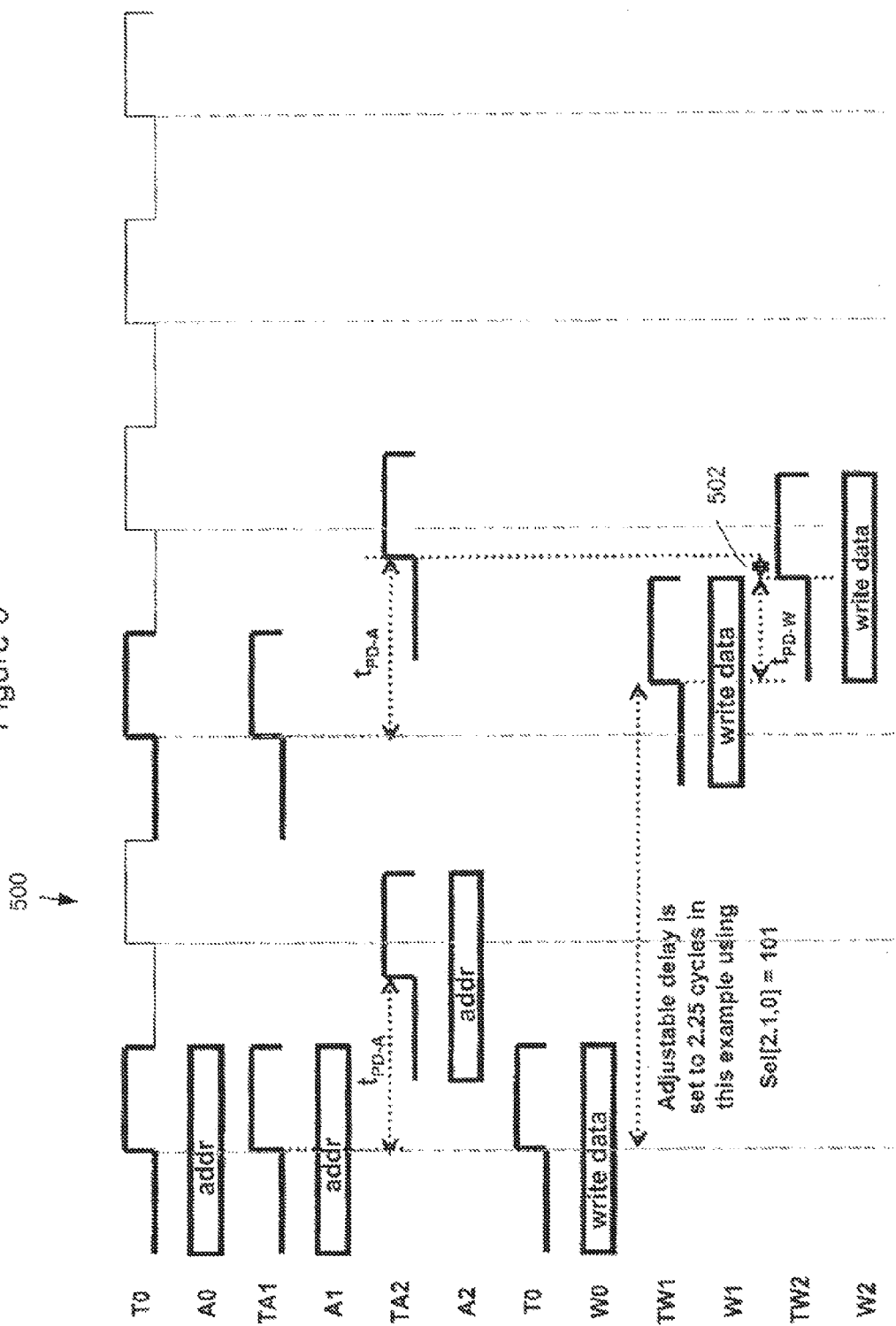
FIG. 5 is a timing diagram for signals of an example write operation in a memory system that generates write data signals with variable delays, under an embodiment.

FIG. 5 is a timing diagram 500 for signals of an example write operation in a memory system that generates write data signals with variable delays, under an embodiment. As described above, a memory controller selects write data for a write operation to a memory component and generates data signals W0 and corresponding data valid signals T0 for use in transferring the data to the memory components via a write data signal path. Additionally the memory controller generates address/control signals A0 and address/control valid signals T0 corresponding to the data signals W0, and transfers the signals A0 and T0 to the memory components via an address/control signal path.

The memory controller uses the data valid signals T0 to generate a number of delayed data valid signals. The delayed data valid signals of an embodiment include a data valid signal delayed approximately 0.00 (1.00) clock periods, a data valid signal delayed approximately 0.25 clock periods, a data valid signal delayed approximately 0.50 clock periods, and a data valid signal delayed approximately 0.75 clock periods, but are not so limited. The memory system also uses the delayed data valid signals along with the data signals W0 to generate a number of delayed data signals. The delayed data signals of an embodiment include a data signal delayed approximately 1.00 clock period, a data signal delayed approximately 1.25 clock periods, a data signal delayed approximately 1.50 clock periods, a data signal delayed approximately 1.75 clock periods, a data signal delayed approximately 2.00 clock periods, a data signal delayed approximately 2.25 clock periods, a data signal delayed approximately 2.50 clock periods, and a data signal delayed approximately 2.75 clock periods, but are not so limited.

The memory controller uses control signals to select one of the delayed data signals and one of the delayed data valid signals for use in the write operation. The selection of the delayed signals is in accordance with pre-determined differences between signal propagation times across the address/control signal path ($t_{PD-A}$) and signal propagation times across the write data signal path ($t_{PD-W}$). In particular, the memory controller selects the signals having a delay value that minimizes the difference between the propagation delay times $t_{PD-A}$ and $t_{PD-W}$.

The pre-determined differences between the signal propagation times are determined during a calibration process, as described above, but are not so limited. This example assumes a difference between propagation delay times that results in selection of a 2.25 clock period delay (corresponding to control signal Sel[2,1,0] that includes logic values "101").

The memory controller drives the address/control signals A0 and address/control valid signals T0 onto the address/control signal path as address/control signals A1 and address/control valid signals TA1. The memory component receives the address/control signals A2 and address/control valid signals TA2 at time $t_{PD-A}$ later following propagation across the address/control signal path.

Under control of control signal Sel[2,1,0] the memory controller drives each of the data signals W1 and data valid signals TW1 onto the write data signal path at a time that is 2.25 clock periods after driving the address/control signals A1 and address/control valid signals TA1. The memory component receives the data signals W2 and data valid signals TW2 at time $t_{PD-W}$ later following propagation across the write data signal path.

Figure 8:
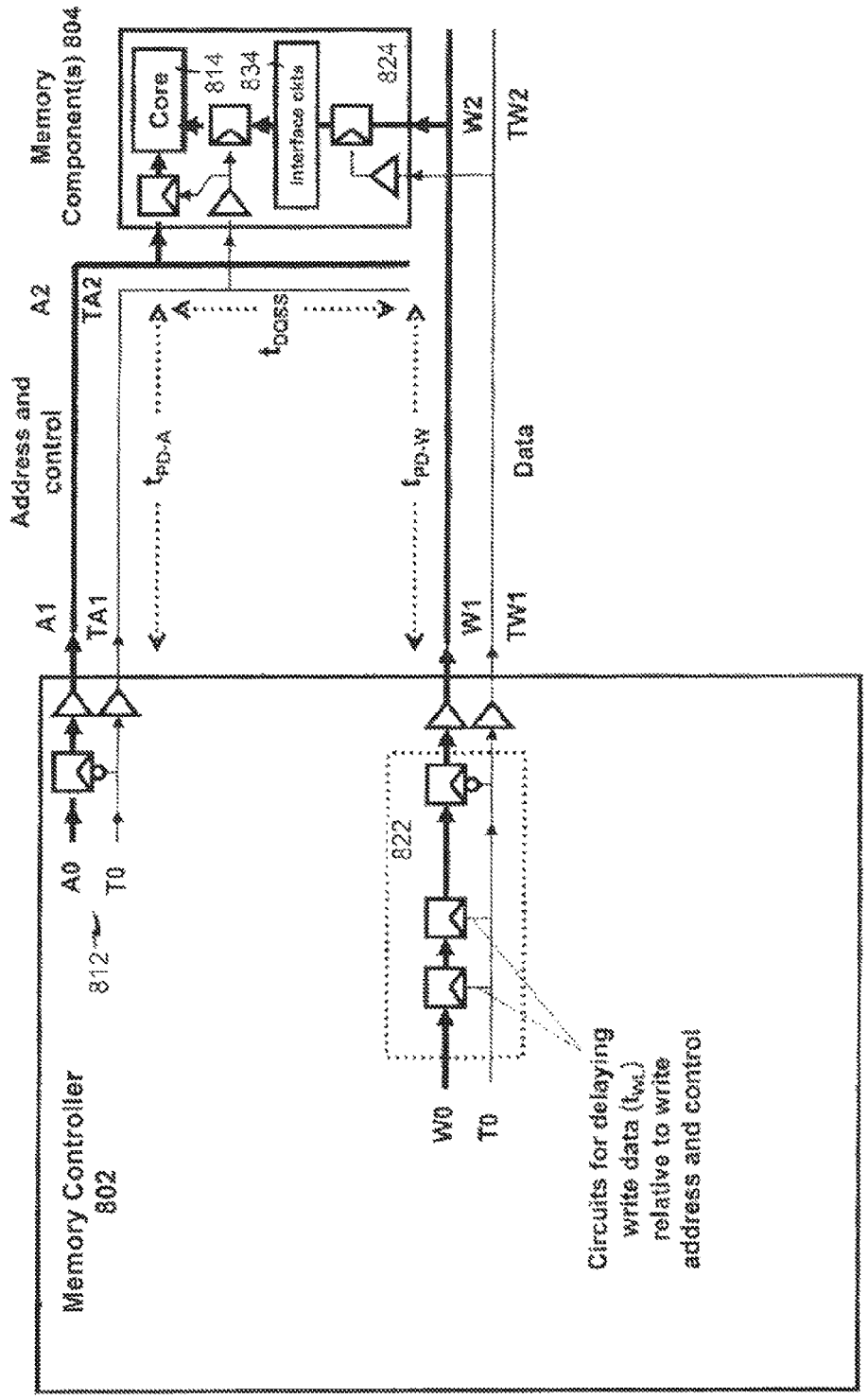
FIG. 8 is a block diagram of a high performance memory system under the prior art.
Figure 9:
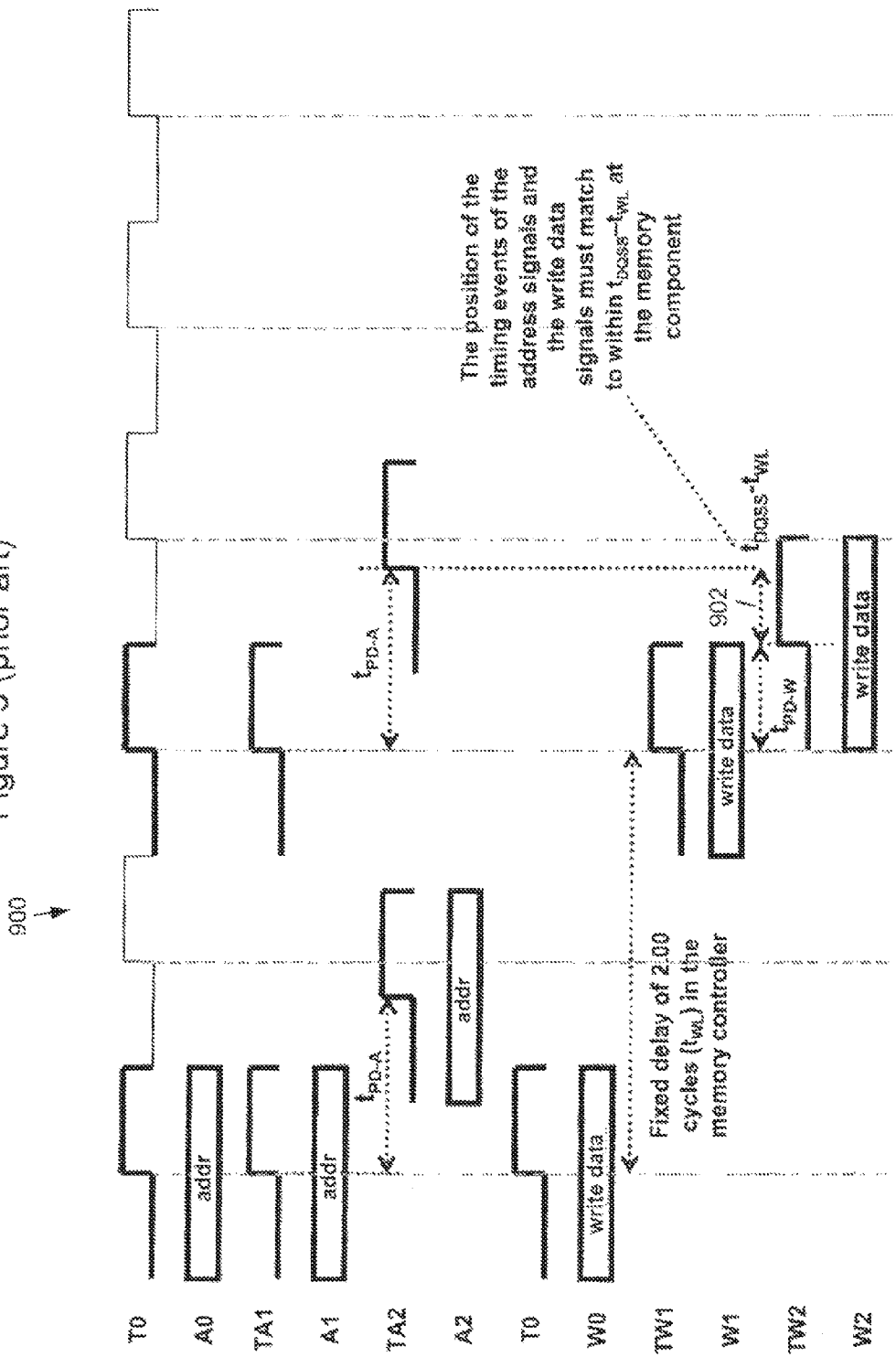
FIG. 9 is a timing diagram showing signals for a write operation in the memory system under the prior art.

While write operations result in a mismatch between the timing of the address/control signals and data signals at the memory component(s), the memory system using variable delay write circuitry reduces the magnitude of this mismatch. A comparison of the signal timing 500 of the memory system using data write signals with variable delays to signal timing 900 of the memory system using data signals with fixed delays, with reference to FIG. 5 and FIG. 9, shows a reduction in the timing mismatch between the timing events in the two systems when using the variable delays. The additional 0.25 clock period delay of the variable delay signal (relative to the fixed delay signal in memory system 800 of FIG. 8) compensates for the fact that the $t_{PD-A}$ delay is greater than the $t_{PD-W}$ delay. Consequently, the difference 502 in rising edge timing events of the address/control signals TA2 and the data signals TW2 using variable delays is reduced when compared to the difference 902 in rising edge timing events of the address/ control signals and the data signals using fixed delays. The closer alignment of the rising edge timing events allows the interface circuitry to readily compensate for the timing mismatch thus increasing the reliability and accuracy of data writes to memory components while relaxing the signal path matching constraints.

One or more alternative embodiments can apply a select delay to independent sets of write data signals WX and timing signals TWX. For example, a memory controller can generate/use one delayed timing signal TW1 for every eight data signals W1. Each group of nine TW1/W1 signals therefore would use the same amount of delay.

Figure 6:
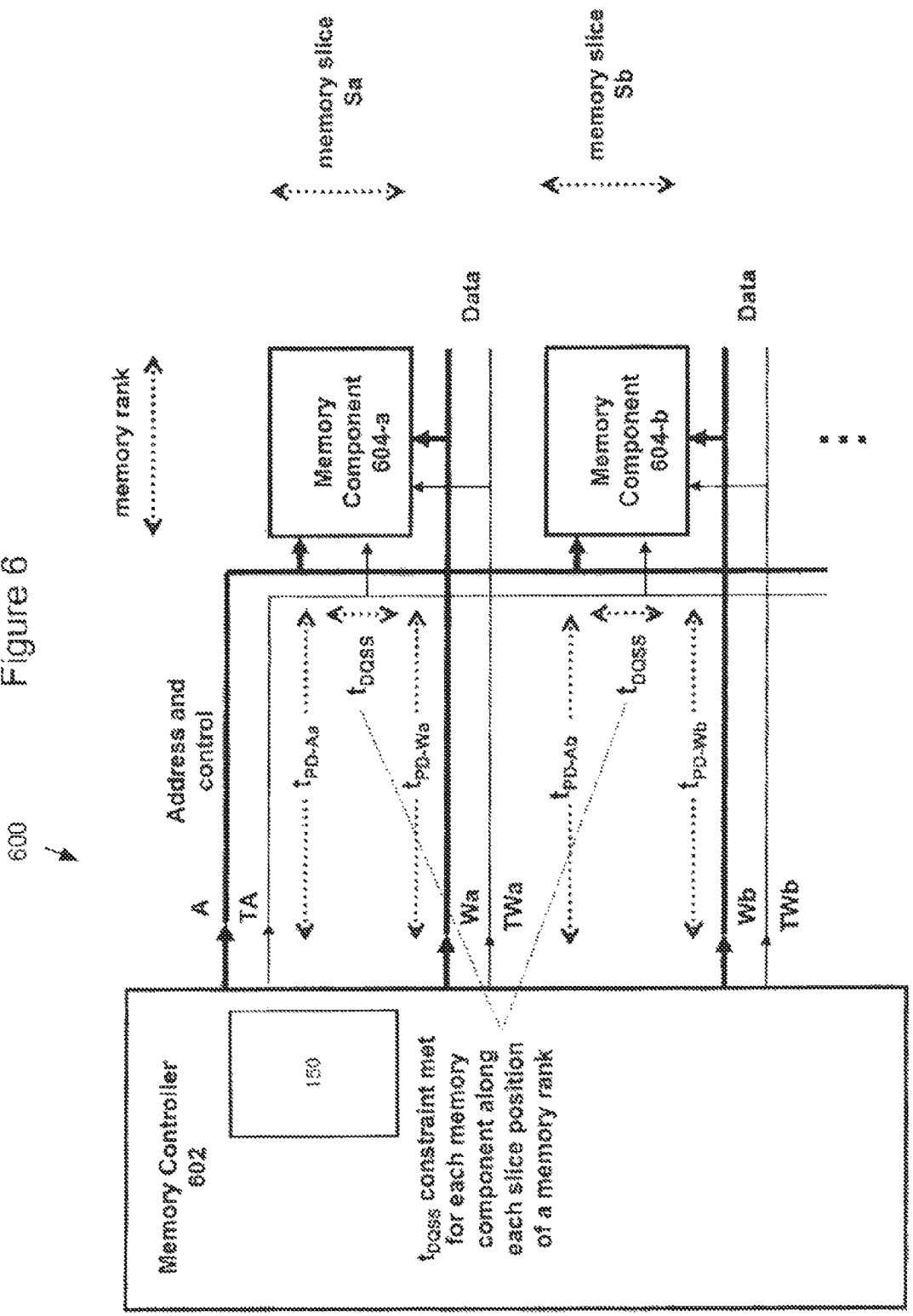
FIG. 6 is a block diagram of a multiple-slice memory system that includes the variable delay write circuitry for generating write data signals and data valid signals with variable delays, under an embodiment.

Furthermore, the variable delay write circuitry of an embodiment also provides increased control over propagation delay differences in write operations to memory components of multiple-slice memory systems. FIG. 6 is a block diagram of a multiple-slice memory system 600 that includes the variable delay write circuitry 150 for generating write data signals and data valid signals with variable delays, under an embodiment. This memory system 600 includes a memory controller 602 coupled to one or more memory components 604-a in memory slice Sa and one or more memory components 604-b in memory slice Sb; while two memory slices are shown the embodiment is not limited to any number of memory slices and/or components. The memory controller 602 drives address/control signals A and address/control valid signals TA to the memory components 604-a/604-b.

Difficulty can be found in controlling the difference between the propagation delays of the TA/A signals and the TW/W signals in this multi-slice memory system because the TA/A signals are coupled to two or more memory components (slices). Each slice Sa and Sb therefore sees a different propagation delay on the TA/A signals ($t_{PD-Aa}$, $t_{PD-Ab}$) as a result. The delay of the TW/W signal groups ($t_{PD-Wa}$, $t_{PD-Wb}$) will however tend to be approximately the same, since these signal groups have a similar routing topology.

The memory controller 602 of an embodiment can use the variable delay write circuitry 150 to accommodate the different propagation delay values between memory slices Sa and Sb. The variable delay write circuitry 150 can be programmed to different delay values for each TW/W signal group in order to accommodate the differences in propagation delays between the TA/A signals to the respective memory slices. For example, the variable delay write circuitry 150 operating generally as described above with reference to FIGS. 1-5 transfers write data signals Wa and write data valid signals TWa to memory component 604-a where signals Wa/TWa are delayed using a first variable delay. Likewise, variable delay write circuitry 150 transfers write data signals Wb and write data valid signals TWb to memory component 604-b where signals Wb/TWb are delayed using a second variable delay.

Figure 7:
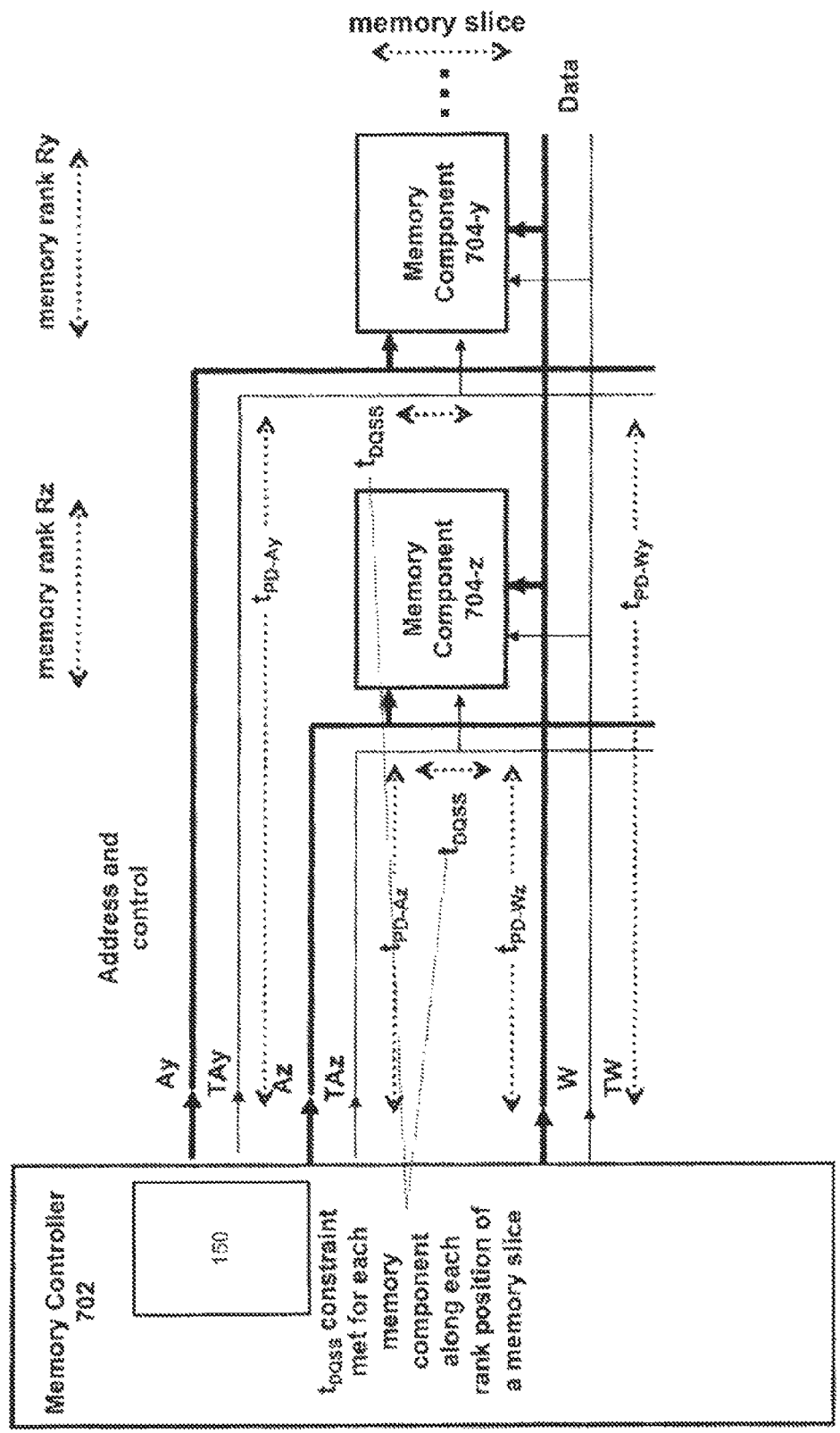
FIG. 7 is a block diagram of a multiple-rank memory system that includes the variable delay write circuitry for generating write data signals and data valid signals with variable delays, under an embodiment.

The variable delay write circuitry of an embodiment also provides increased control over propagation delay differences in write operations to memory components of multiple-rank memory systems. FIG. 7 is a block diagram of a multiple-rank memory system 700 that includes the variable delay write circuitry 150 for generating write data signals and data valid signals with variable delays, under an embodiment. This memory system 700 includes a memory controller 702 coupled to on or more memory components 704-z in memory rank Rz and one or more memory components 704-y in memory rank Ry; while two memory ranks are shown the embodiment is not limited to any number of memory ranks and/or components. The memory controller 702 drives write data signals W and write data valid signals TW to the memory components 704-z/704-y.

Difficulty can be found in controlling the difference between the propagation delays of the TA/A signals and the TW/W signals in this multi-rank memory system because the TW/W signals are coupled to two or more memory components (ranks). Each rank Rz and Ry therefore sees a different propagation delay on the TW/W signals ($t_{PD-Wz}$, $t_{PD-Wy}$) as a result. The delay of the TA/A signal groups ($t_{PD-Az}$, $t_{PD-Ay}$) will however tend to be approximately the same, since these signal groups have a similar routing topology.

The memory controller 702 of an embodiment can use the variable delay write circuitry 150 to accommodate the different propagation delay values between memory ranks Rz and Ry. The variable delay write circuitry 150 can be programmed to different delay values for each TA/A signal group in order to accommodate the differences in propagation delays between the TW/W signals to the respective memory ranks. For example, the variable delay write circuitry 150 operating generally as described above with reference to FIGS. 1-5 transfers address/control signals Az and address/control valid signals TAz to memory component 704-z where signals Az/TAz are delayed using a first variable delay. Likewise, variable delay write circuitry 150 transfers address/control signals Ay and address/control valid signals TAy to memory component 704-y where signals Ay/TAy are delayed using a second variable delay.

The components of the memory systems described above include any collection of computing components and devices operating together. The components of the memory systems can also be components or subsystems within a larger computer system or network. The memory system components can also be coupled among any number of components (not shown), for example other buses, controllers, memory devices, and data input/output (I/O) devices, in any number of combinations. Many of these system components may be soldered to a common printed circuit board (for example, a graphics card or game console device), or may be integrated in a system that includes several printed circuit boards that are coupled together in a system, for example, using connector and socket interfaces such as those employed by personal computer motherboards and dual inline memory modules ("DIMM"). In other examples, complete systems may be integrated in a single package housing a system in package ("SIP") type of approach. Integrated circuit devices may be stacked on top of one another and utilize wire bond connections to effectuate communication between chips or may be integrated on a single planar substrate within the package housing.

Further, functions of the memory system components can be distributed among any number/combination of other processor-based components. The memory systems described above include, for example, various dynamic random access memory (DRAM) systems. As examples, the DRAM memory systems can include double data rate ("DDR") systems like DDR SDRAM as well as DDR2 SDRAM and other DDR SDRAM variants, such as Graphics DDR ("GDDR") and further generations of these memory technologies, i.e., GDDR2, and GDDR3, but is not limited to these memory systems.

Aspects of the system for per-bit offset control and calibration described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the per-bit offset control and calibration system include: microcontrollers with memory (such as electronically erasable programmable read only memory (EEPROM)), embedded microprocessors, firmware, software, etc. Furthermore, aspects of the per-bit offset control and calibration system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the memory systems and methods is not intended to be exhaustive or to limit the memory systems and methods to the precise form disclosed. While specific embodiments of, and examples for, the memory systems and methods are described herein for illustrative purposes, various equivalent modifications are possible within the scope of the memory systems and methods, as those skilled in the relevant art will recognize. The teachings of the memory systems and methods provided herein can be applied to other processing systems and methods, not only for the memory systems and methods described above.

The elements and acts of the various embodiments described above can be combined to provide further embodiments. These and other changes can be made to the memory systems and methods in light of the above detailed description.

In general, in the following claims, the terms used should not be construed to limit the memory systems and methods to the specific embodiments disclosed in the specification and the claims, but should be construed to include all processing systems that operate under the claims. Accordingly, the memory systems and methods is not limited by the disclosure, but instead the scope of the memory systems and methods is to be determined entirely by the claims.

While certain aspects of the memory systems and methods are presented below in certain claim forms, the inventor contemplates the various aspects of the memory systems and methods in any number of claim forms. For example, while only one aspect of the system is recited as embodied in computer-readable medium, other aspects may likewise be embodied in computer-readable medium. Accordingly, the inventor reserves the right to add additional claims after filing the application to pursue such additional claim forms for other aspects of the memory systems and methods.

What is claimed is:

1. A memory component comprising:
a core of dynamic random access memory cells;
a first circuit to receive, from a first external signal path, control information that specifies a write operation;
a second circuit to receive, from a second external signal path, write data corresponding to the write operation;
a third circuit, coupled to the second circuit, to receive a timing signal that indicates that the write data is valid write data, the third circuit being operable in a calibration mode to receive multiple delayed versions of the timing signal;
a fourth circuit to receive, from a fourth external signal path, a clock signal that controls reception of the control information within the first circuit; and
a fifth circuit to output signals corresponding to the multiple delayed versions of the timing signal to enable determination, in a memory controller, of a delay time between outputting the control information on the first external signal path and outputting the write data on the second external signal path, the delay time to compensate for a propagation difference between a propagation time of the control information propagating on the first external signal path and a propagation time of the write data propagating on the second external signal path.

2. The memory component of claim 1, wherein the timing signal transitions between signal levels to indicate that the write data is valid write data, and wherein the timing signal lacks transitions during an interval in which no data is conveyed on the external signal path.

3. The memory component of claim 1, wherein a rising edge transition of the timing signal indicates a valid first symbol of the write data, and a falling edge transition of the timing signal indicates a valid second symbol of the write data.

4. The memory component of claim 1, wherein the timing signal is a clock signal.

5. A method of operation within a memory component, the method comprising:
   receiving, via a first external signal path, control information that specifies a write operation;
   receiving, via a second external signal path, write data corresponding to the write operation;
   receiving, via a third external signal path, a timing signal that indicates that the control information is valid on the first external signal path;
   receiving a plurality of delayed versions of a timing signal during a calibration mode of the memory component, wherein a rising edge transition of each delayed version of the timing signal indicates a respective valid first symbol of the write data, and a falling edge transition of each delayed version of the timing signal indicates a respective valid second symbol of the write data; and
   outputting, during the calibration mode of the memory component, signals corresponding to the plurality of delayed versions of the timing signal onto the second external signal path.

6. The method of claim 5 wherein each delayed version of the timing signal conveys valid write timing information for a respective group of eight write data signals of the write data received via the second external signal path.

7. The method of claim 5 wherein a routing topology of the third external signal path is similar to a routing topology of the first external signal path.

8. The method of claim 5 further comprising receiving, via the first external signal path, address information that identifies a memory location within a core of dynamic random access memory cells for the write operation, wherein the timing signal indicating that the control information is valid on the first external signal path indicates that the address information is valid on the first external signal path.

9. The method of claim 5 wherein outputting, during the calibration mode of the memory component, signals corresponding to the plurality of delayed versions of the timing signal onto the second external signal path comprises outputting read data corresponding to the plurality of delayed versions of the timing signal onto the second external signal path.

10. A method of operation within a memory component, the method comprising:
   receiving, via a first external signal path, control information that specifies a write operation;
   receiving, via a second external signal path, write data corresponding to the write operation;
   receiving, from a third external signal path, a clock signal that controls reception of the control information;
   receiving a timing signal that indicates that the write data is valid write data, including receiving, while operating in a calibration mode, multiple delayed versions of the timing signal; and
   outputting signals corresponding to the multiple delayed versions of the timing signal to enable determination, in a memory controller, of a delay interval between outputting the control information on the first external signal path and outputting the write data on the second external signal path, the delay interval to compensate for a propagation difference between a propagation time of the control information on the first external signal path and a propagation time of the write data on the second external signal path.

11. The method of claim 10 wherein a rising edge transition of the timing signal indicates a valid first symbol of the write data, and a falling edge transition of the timing signal indicates a valid second symbol of the write data.

12. The method of claim 10 wherein the timing signal is a clock signal.

13. The method of claim 10 wherein the timing signal transitions between signal levels to indicate that the write data is valid write data, and wherein the timing signal lacks transitions during an interval in which no data is conveyed on the external signal path.

14. The method of claim 10 wherein outputting signals corresponding to the multiple delayed versions of the timing signal comprises outputting read data corresponding to the multiple delayed versions of the timing signal.

15. The method of claim 10 wherein receiving write data corresponding to the write operation comprises receiving multiple delayed versions of the write data that correspond to the multiple delayed versions of the timing signal.

16. A memory component having a core of dynamic random access memory cells, the memory component comprising:
   a first circuit to receive, from a first external signal path, control information that specifies a write operation;
   a second circuit to receive, from a second external signal path, write data corresponding to the write operation;
   a third circuit, coupled to the second circuit, to receive a timing signal, wherein a rising edge transition of the timing signal indicates a valid first symbol of the write data, and a falling edge transition of the timing signal indicates a valid second symbol of the write data, wherein, during a calibration mode of the memory component, the third circuit is operable to receive a plurality of delayed versions of the signal; and
   a fourth circuit to output, during the calibration mode of the memory component, signals corresponding to the plurality of delayed versions of the timing signal onto the second external signal path.

17. The memory component of claim 16, wherein the timing signal conveys valid write timing information for a group of eight write data signals of the write data received from the second external signal path.

18. The memory component of claim 16, further comprising a fifth circuit to receive a timing signal, from a third external signal path, that indicates that the control information is valid on the first external signal path, wherein a routing topology of the third external signal path is similar to a routing topology of the first external signal path.

19. The memory component of claim 16, further comprising a circuit to receive, from the first external signal path, address information that identifies a memory location of the core of dynamic random access memory cells for the write operation, wherein the timing signal indicating that the control information is valid on the first external signal path indicates that the address information is valid on the first external signal path.

20. The memory component of claim 16, wherein the memory component is a double data rate memory component.

21. The memory component of claim 16, wherein the fourth circuit to output, during the calibration mode of the memory component, signals corresponding to the plurality of delayed versions of the timing signal onto the second external signal path comprises circuitry to output read data corresponding to the plurality of delayed versions of the timing signal onto the second external signal path.

* * * * *